US006942499B2

(12) United States Patent
Tanaka et al.

(10) Patent No.: US 6,942,499 B2
(45) Date of Patent: Sep. 13, 2005

(54) TERMINAL HOLDING AND HEAT DISSIPATING STRUCTURE

(75) Inventors: Yoshiyuki Tanaka, Haibara-gun (JP); Hiroyuki Ashiya, Haibara-gun (JP); Yayoi Maki, Haibara-gun (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/091,183

(22) Filed: Mar. 6, 2002

(65) Prior Publication Data

US 2002/0124994 A1 Sep. 12, 2002

(30) Foreign Application Priority Data

Mar. 7, 2001 (JP) ..................................... P2001-063141
Mar. 7, 2001 (JP) ..................................... P2001-063146
Mar. 7, 2001 (JP) ..................................... P2001-063154

(51) Int. Cl.[7] ................................................ H01R 12/00
(52) U.S. Cl. ........................................ 439/76.2; 439/83
(58) Field of Search ............................... 439/76.2, 76.1, 439/949, 82, 83, 622, 79, 62, 74, 75

(56) References Cited

U.S. PATENT DOCUMENTS

| | | | | |
|---|---|---|---|---|
| 4,603,930 A | | 8/1986 | Ito | |
| 4,951,124 A | | 8/1990 | Sawaya | |
| 5,975,918 A | * | 11/1999 | Quillet et al. | 439/79 |
| 6,126,457 A | | 10/2000 | Smith et al. | |
| 6,270,359 B1 | * | 8/2001 | Kondo et al. | 439/76.2 |
| 6,315,615 B1 | * | 11/2001 | Raistrick | 439/637 |
| 6,396,702 B1 | * | 5/2002 | Boucheron et al. | 361/752 |

FOREIGN PATENT DOCUMENTS

| | | |
|---|---|---|
| DE | 78 11 673 U | 8/1978 |
| EP | 0 713 234 A2 | 5/1996 |
| JP | 8-124635 | 5/1996 |
| JP | 8-171950 | 7/1996 |
| JP | 9-186475 | 7/1997 |
| JP | 10-223284 | 8/1998 |
| JP | 2000-68622 | 3/2000 |
| JP | 2000 223861 A | 8/2000 |
| JP | 2000-260514 | 9/2000 |

* cited by examiner

*Primary Examiner*—Ross Gushi
(74) *Attorney, Agent, or Firm*—Sughrue Mion, PLLC

(57) ABSTRACT

In a structure for holding a terminal in which a soldering portion of the terminal is inserted into a connecting hole of a substrate, and a land portion on the substrate and the soldering portion of the terminal are held by soldering with the terminal set upright, a terminal plate for guiding the soldering portion of the terminal into the connecting hole of the substrate is disposed at a position opposing the substrate and spaced apart therefrom with a predetermined clearance, and a positioning hole for holding an intermediate portion of the terminal is provided in the terminal plate, while a retaining portion which is retained in the positioning hole of the terminal plate is provided in the intermediate portion of the terminal.

6 Claims, 19 Drawing Sheets

TERMINAL HOLDING AND HEAT DISSIPATING STRUCTURE

BACKGROUND OF THE INVENTION

1. Field of the Invention

The present invention relates to a terminal structure of a straight terminal such as a wide terminal for conducting a large current to be attached to a printed circuit board for an electronic control unit (ECU) or the like by soldering. Particularly, the invention relates to a holding structure and a heat dissipating structure thereof.

2. Description of the Related Arts

As a terminal holding structure of this type, one disclosed in JP-A-2000-68622 shown in FIGS. 20A and 20B is known. In this holding structure, a pair of upper and lower projecting portions 2 and 3 jutting out laterally with an interval corresponding to the thickness of a printed circuit board 5 therebetween are provided at a proximal portion of a plate-like straight terminal 1, as shown in FIGS. 20A and 20B.

Further, when the terminal 1 is inserted into an attaching hole 6 of the printed circuit board 5, the lower projecting portion 3 jutting out from both lateral sides of the proximal portion of the terminal 1 is inserted through a pair of semicircular slits 6*a* formed in an inner peripheral surface of the attaching hole 6 at positions opposing each other in the diametrical direction of the attaching hole 6, and the pair of projecting portions 2 and 3 are engaged with peripheral edge portions of the attaching hole 6 by rotating the terminal 1 by a predetermined angle. In the state in which the printed circuit board 5 is clamped by the pair of projecting portions 2 and 3 of this terminal 1, the proximal portion of the terminal 1 and a land portion 7 formed around the attaching hole 6 of the printed circuit board 5 are soldered so as to mount the terminal 1 in a state of being set vertically upright on the printed circuit board 5. This soldered portion (solder fillet) is denoted by reference numeral 8.

However, with the above-described conventional structure for holding the terminal 1 on the printed circuit board 5, since soldering is effected in such a manner as to completely cover the pair of projecting portions 2 and 3 of the terminal 1 for clamping the printed circuit board 5 (i.e., the distance between each of the pair of projecting portions 2 and 3 of the terminal 1 and the soldered portion 8 is very small), when an electric component such as an external connector is attached to or detached from the terminal 1, a large mechanical stress is directly applied to the soldered portion 8 from the vertical direction through the pair of projecting portions 2 and 3 of the terminal 1. Hence, a solder crack has been liable to occur in the soldered portion 8. In addition, a large thermal stress is directly applied to the soldered portion 8 through the pair of projecting portions 2 and 3 of the terminal 1 due to the environmental heat in the surroundings and the heat generated by such as the self heating of an electronic component including a fuse or a relay connected to the terminal 1. Hence, a solder crack has been liable to occur in the soldered portion 8. Furthermore, since the structure adopted is such that the land portion 7 on the printed circuit board 5 is clamped by the pair of projecting portions 2 and 3 of the terminal 1, the land portion 7 has been liable to be damaged by the pair of projecting portions 2 and 3 of the terminal 1.

Another terminal structures of related art are shown in FIGS. 21A, 21B and FIG. 22. In the holding structure shown as in FIG. 21A, a soldering portion 102 at a lower end of a plate-like wide terminal 101 for conducting a large current is inserted into a connecting hole 106 formed in a printed circuit board 105, and the soldering portion 102 of the terminal 101 is fixed by soldering to a land portion 107 formed around the connecting hole 106 on the lower surface of the printed circuit board 105. As shown in FIG. 21B, the land portion 107 is formed in a substantially annular elliptical shape having an elliptical elongated hole 107*a* in its center. A soldered portion (solder fillet) is denoted by reference numeral 108 in FIG. 21A.

In the terminal structure shown in FIG. 22, a soldering portion 202 at a lower end of a straight terminal 201 is inserted into a connecting hole 206 formed in a printed circuit board 205, and the soldering portion 202 of the terminal 201 is fixed by soldering to a land portion 207 formed around the connecting hole 206 on the lower surface of the printed circuit board 205. A heat generating component 204 such as a fuse or a relay is detachably connected to an upper end 203 of the terminal 201. A soldered portion (solder fillet) is denoted by reference numeral 208 in FIG. 22.

However, with the above-described conventional structures for attaching the terminals 101, 201 to the printed circuit boards 105, 205, when a large current is conducted in a state in which the heat generating component 104 (204) such as the fuse or the relay is fitted to the upper end 103 (203) of the terminal 102 (202), and the soldering portion 102 (202) of the terminal 101 (201) is soldered to the land portion 107 (207) of the circuit board 105 (205), in a case where the component body of the heat generating component and fitting portions of the heat generating component 104 (204) and the upper end 103 (203) of the terminal 101 (201) have generated heat, the heat is directly transmitted to the soldered portion 108 (208) through the terminal 101 (201) in the form of a thermal stress. Hence, a solder crack has been liable to occur in the soldered portion 108 (208).

Further, in the holding structure of the terminal 101, since the land portion 107 which is formed on the lower surface of the printed circuit board 105 has in its center the elliptical elongated hole 107*a*, the durability of the land portion 107 has been inferior and liable to be damaged. Hence, the fabrication cost of the printed circuit board 105 has been high to improve the quality.

In the holding structure of the terminal 201, when the heat generating component 204 is attached to or detached from the upper end 203 of the terminal 201, a large mechanical stress is directly applied from the vertical direction to the soldered portion 208 through the soldering portion 202 of the terminal 201. Hence, a solder crack has been liable to occur in the soldered portion 208.

SUMMARY OF THE INVENTION

Accordingly, the invention has been devised to overcome the above-described problems, and its object is to provide a terminal structure which makes it possible to alleviate stresses including the mechanical stress and the thermal stress applied to the soldered portion, thereby making it possible to reliably prevent the occurrence of the solder crack.

(1) In the invention, there is provided a holding structure of a terminal and a substrate, wherein a soldering portion of the terminal is inserted into a connecting hole of the substrate, and a land portion provided on the substrate and the soldering portion of the terminal are held by soldering with the terminal which is set upright, the holding structure comprising: a terminal plate for guiding the soldering portion into the connecting hole to a position opposing the substrate, forming a predetermined clearance; a positioning hole for holding an intermediate portion of the terminal provided in the terminal plate; and a retaining portion retained in the positioning hole of the terminal plate is provided in the intermediate portion of the terminal.

With this terminal holding structure, since the retaining portion provided in the intermediate portion of the terminal is retained in the positioning hole of the terminal plate which is disposed at a position opposing the substrate and spaced apart therefrom with a predetermined clearance, when an electric component is attached to or detached from the terminal, a mechanical stress applied to a soldered portion between the soldering portion of the terminal and a land portion on the substrate is alleviated. In addition, since the retaining portion of the terminal which is retained in the positioning hole of the terminal plate is located away from the soldered portion, a thermal stress applied to the soldered portion is alleviated. Furthermore, since the retaining portion of the terminal and the land portion on the substrate are located away from each other, the land portion is not damaged by the retaining portion of the terminal. For these reasons, the occurrence of the solder crack in the soldered portion is reliably prevented.

(2) In the invention, there is provided the terminal holding structure according to (1), wherein the positioning hole of the terminal plate is formed on a terminal press-fitting portion projecting upwardly from an upper surface of the terminal plate.

With this terminal holding structure, since the positioning hole of the terminal plate is provided in the terminal press-fitting portion projecting upwardly from the upper surface of the terminal plate, a sufficient distance is secured between the retaining portion of the terminal and the soldered portion, thereby alleviating stresses such as the mechanical stress and the thermal stress applied to the soldered portion. In addition, the environmental heat in the surroundings and the heat generated by such as the self heating of a heat generating component connected to the terminal are dissipated from the retaining portion of the terminal to the terminal plate side, thereby improving the heat dissipating effect.

In the invention, there is provided a holding structure of a terminal and a substrate, comprising: a plurality of soldering portions formed by dividing a soldering proximal portion of the terminal into small portions; wherein the soldering portions are held on a land portion of the substrate by soldering.

With this terminal holding structure, since a plurality of soldering portions are formed by dividing the soldering portion of the terminal into small portions, a solder stress due to heat applied to the soldered portion between each of the plurality of soldering portions of the terminal and the land portion of the substrate is alleviated by the division of the terminal into small portions, thereby reliably preventing the occurrence of a solder crack in the soldered portion.

(4) In the invention, there is provided the terminal holding structure according to (3), wherein connecting holes are respectively formed in the substrate at positions opposing the plurality of soldering portions, and round terminal inserting holes are respectively formed in the land portion at positions opposing the plurality of soldering portions.

With this terminal holding structure, since connecting holes are respectively formed in the substrate at positions opposing the plurality of soldering portions, and round terminal inserting holes are respectively formed in the land portion at positions opposing the plurality of soldering portions, a high-quality substrate is fabricated at low cost.

(5) In the invention, there is provided the terminal holding structure according to (4), wherein an indented portion is formed in a peripheral side of a central portion of the land portion located between the terminal inserting holes.

With this terminal holding structure, since the indented portion is formed in a peripheral side of the central portion of the land portion between the terminal inserting holes, a satisfactory solder fillet is formed by means of this indented portion, thereby improving the durability of the soldered portion.

(6) In the invention, there is provided a heat dissipating structure for a terminal, wherein one end of the terminal is connectable to a heat generating component and another end of the terminal is soldered in an upright state to a substrate, heat dissipating structure comprising: a wide flat portion formed by being bent at an intermediate portion of the terminal; a heat insulating plate disposed at a position opposing the substrate with a predetermined clearance; wherein the flat portion of the terminal is made capable of freely abutting against a terminal pressing portion provided on the heat insulating plate.

With this heat dissipating structure for a terminal, since heat which is caused by the self heating of a heat generating component connected to one end side of the terminal, and which is transmitted to the soldered portion between the other end side of the terminal and the substrate, is dissipated from the wide flat portion formed by being bent at the intermediate portion of the terminal to the terminal pressing portion side of the heat insulating plate, thereby improving the heat dissipating effect. In addition, since the wide flat portion at the intermediate portion of the terminal abuts against the terminal pressing portion of the heat insulating plate disposed at a position opposing the substrate and spaced apart therefrom with a predetermined clearance, and is located away from the soldered portion, the thermal stress applied to the soldered portion is alleviated. For these reasons, the occurrence of a solder crack in the soldered portion is prevented.

(7) In the invention, the heat dissipating structure for a terminal according to (6), wherein a resin plate cover for covering the heat insulating plate is provided in such a manner as to be spaced apart from the heat insulating plate with a predetermined clearance, and the flat portion of the terminal is capable of being freely clamped by the terminal pressing portion of the heat insulating plate and a terminal pressing portion provided on the plate cover.

With this heat dissipating structure for a terminal, since the flat portion of the terminal is capable of being freely clamped by the terminal pressing portion of the heat insulating plate and the terminal pressing portion of the plate cover for covering the heat insulating plate, the heat which is caused by the self heating of a heat generating component connected to one end side of the terminal, and which is transmitted to the soldered portion between the other end side of the terminal and the substrate, is efficiently dissipated from the flat portion of the terminal to the sides of the respective terminal pressing portions of the heat insulating plate and the plate cover, respectively, thereby further improving the heat dissipating effect. In addition, since the flat portion of the terminal is clamped and fixed by the terminal pressing portion of the heat insulating plate and the terminal pressing portion of the plate cover, when the heat generating component is attached to or detached from one end side of the terminal, the dynamic stress applied to the soldered portion is alleviated. For these reasons, stresses including the thermal stress and the dynamic stress applied to the soldered portion are alleviated, thereby reliably preventing the occurrence of the solder crack in the soldered portion.

DETAILED DESCRIPTION OF THE PREFERRED EMBODIMENTS

Figure 1:
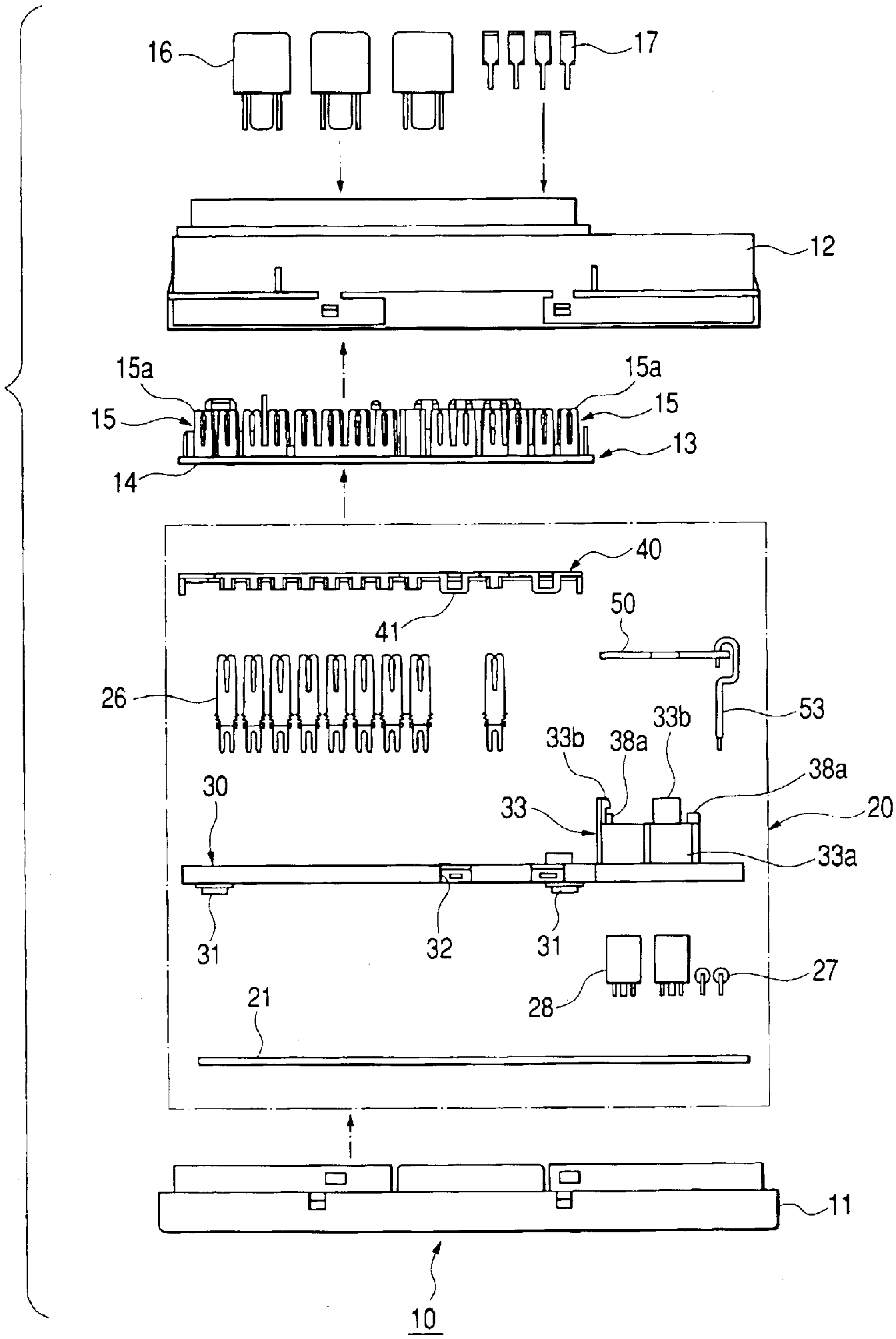
FIG. 1 is an exploded front elevational view illustrating an electric junction box of an electronic control unit-integrated type.

Referring now to the drawings, a description will be given of an embodiment of the invention.

Figure 2:
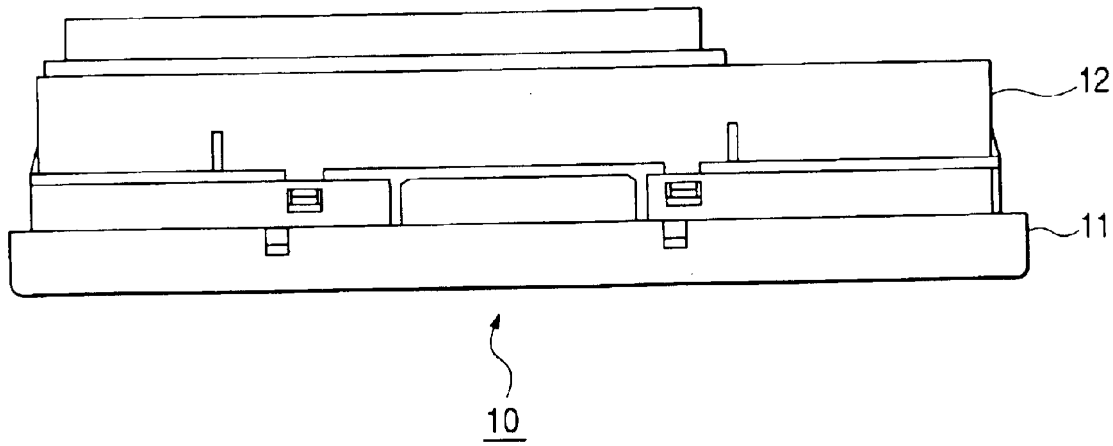
FIG. 2 is a front elevational view of the electric junction box.
Figure 3:
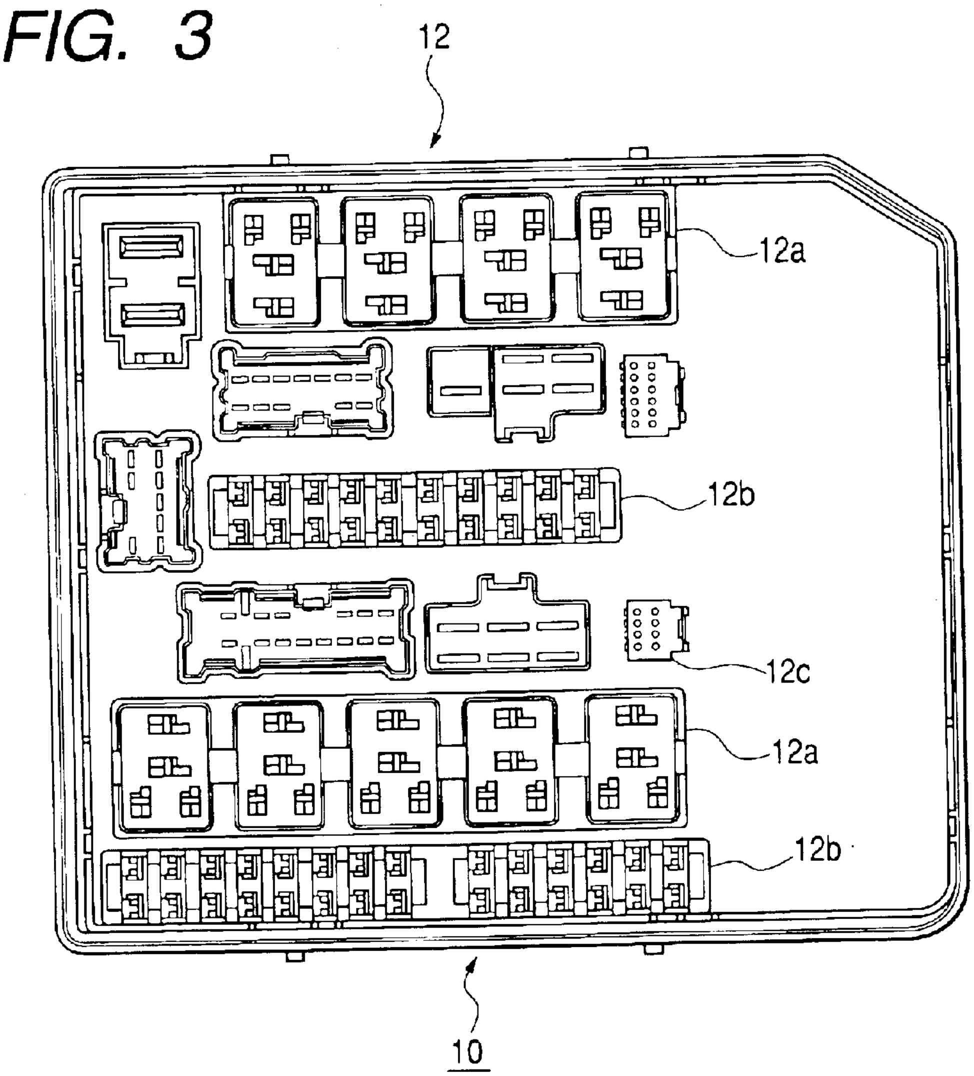
FIG. 3 is a plan view of the electric junction box.
Figure 4:
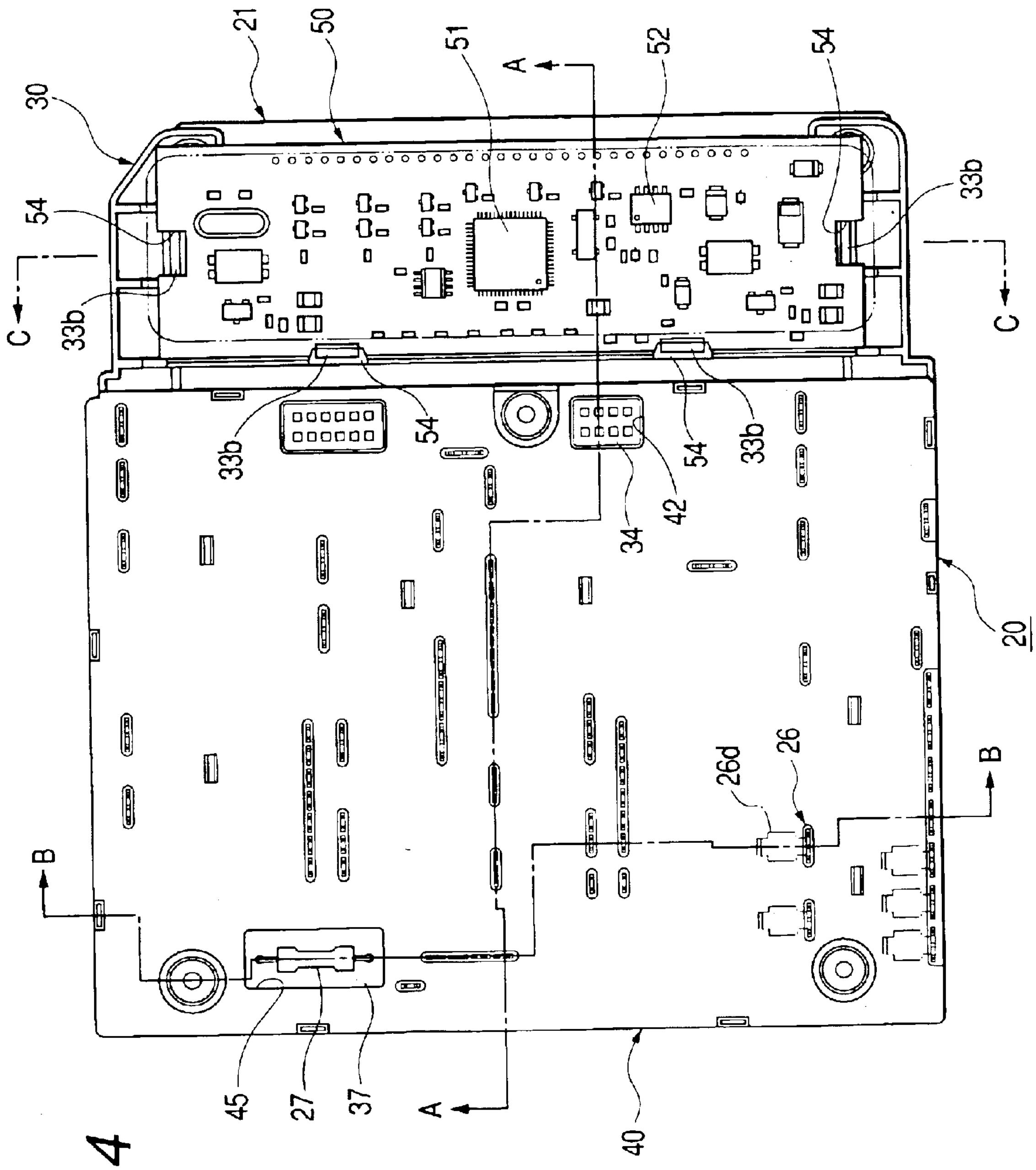
FIG. 4 is a plan view of an electronic control unit incorporated in the electric junction box.
Figure 5:
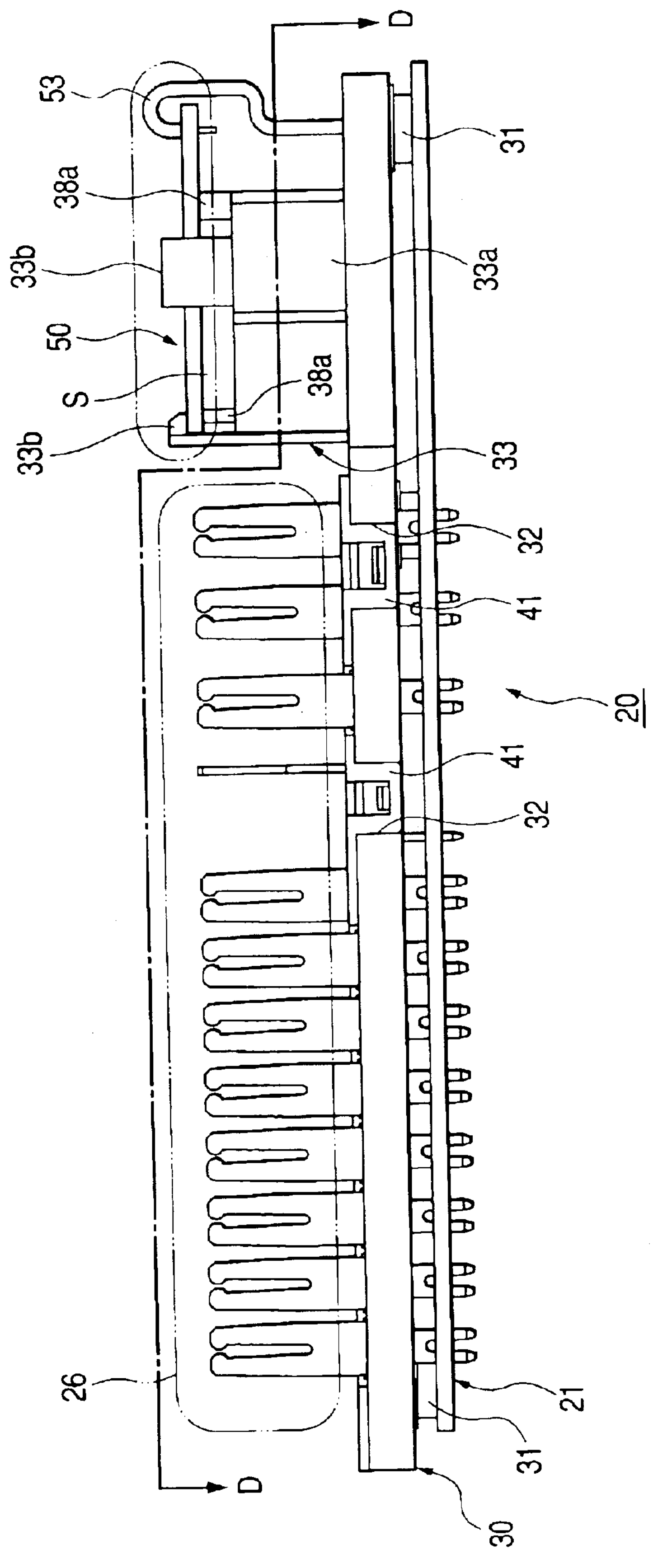
FIG. 5 is a front elevational view of the electronic control unit.
Figure 6:
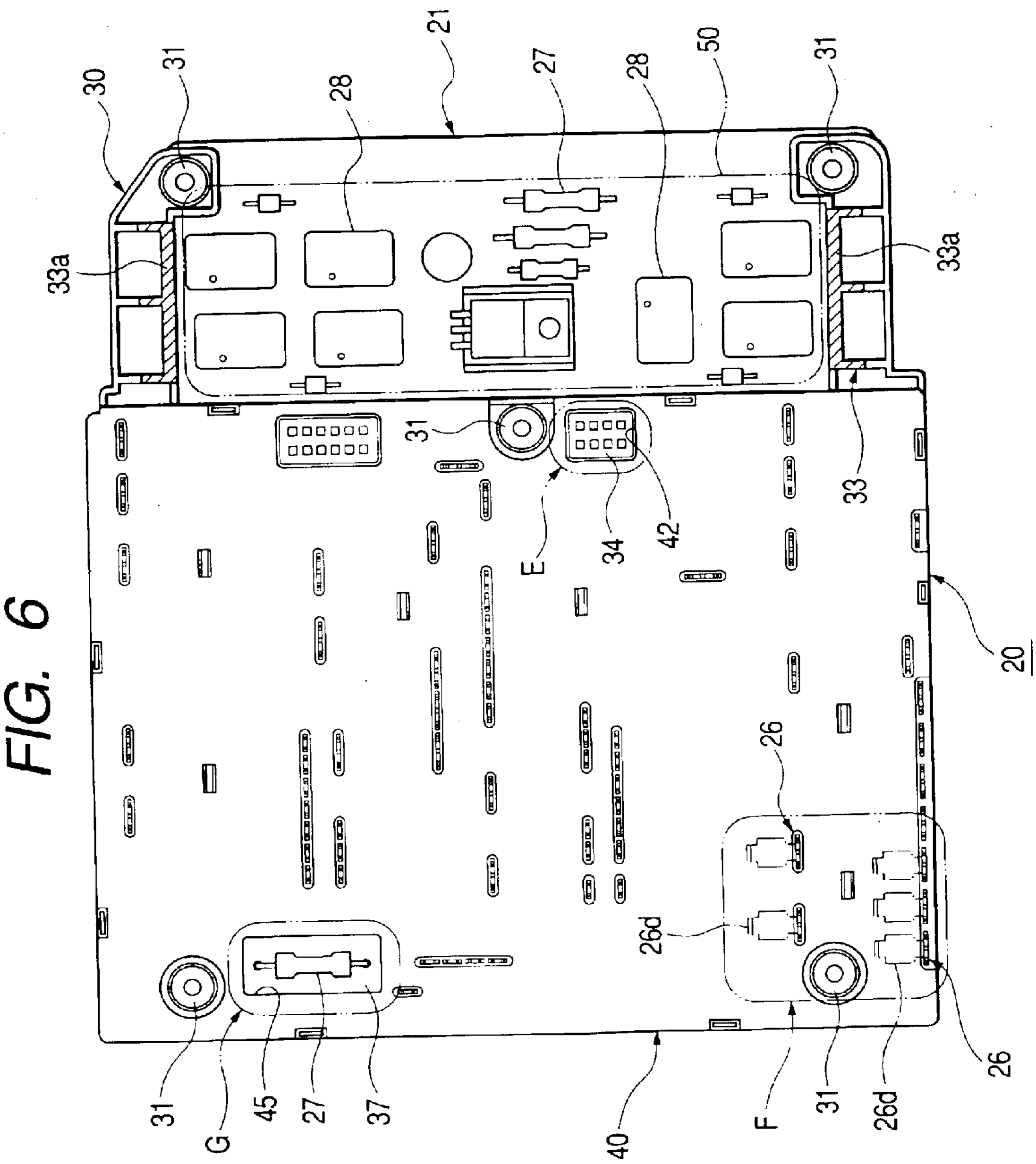
FIG. 6 is a cross-sectional view taken along line D—D in FIG. 5.
Figure 7:
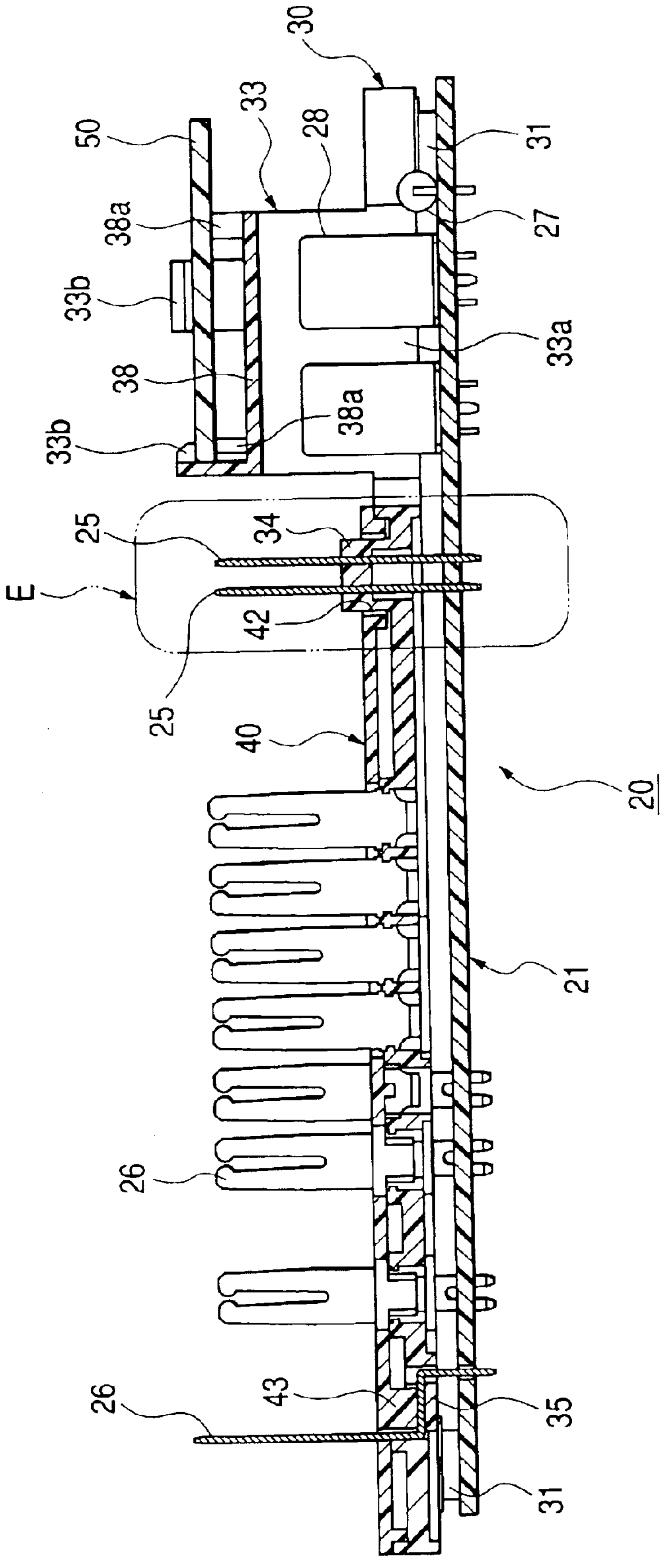
FIG. 7 is a cross-sectional view taken along line A—A in FIG. 4.
Figure 8:
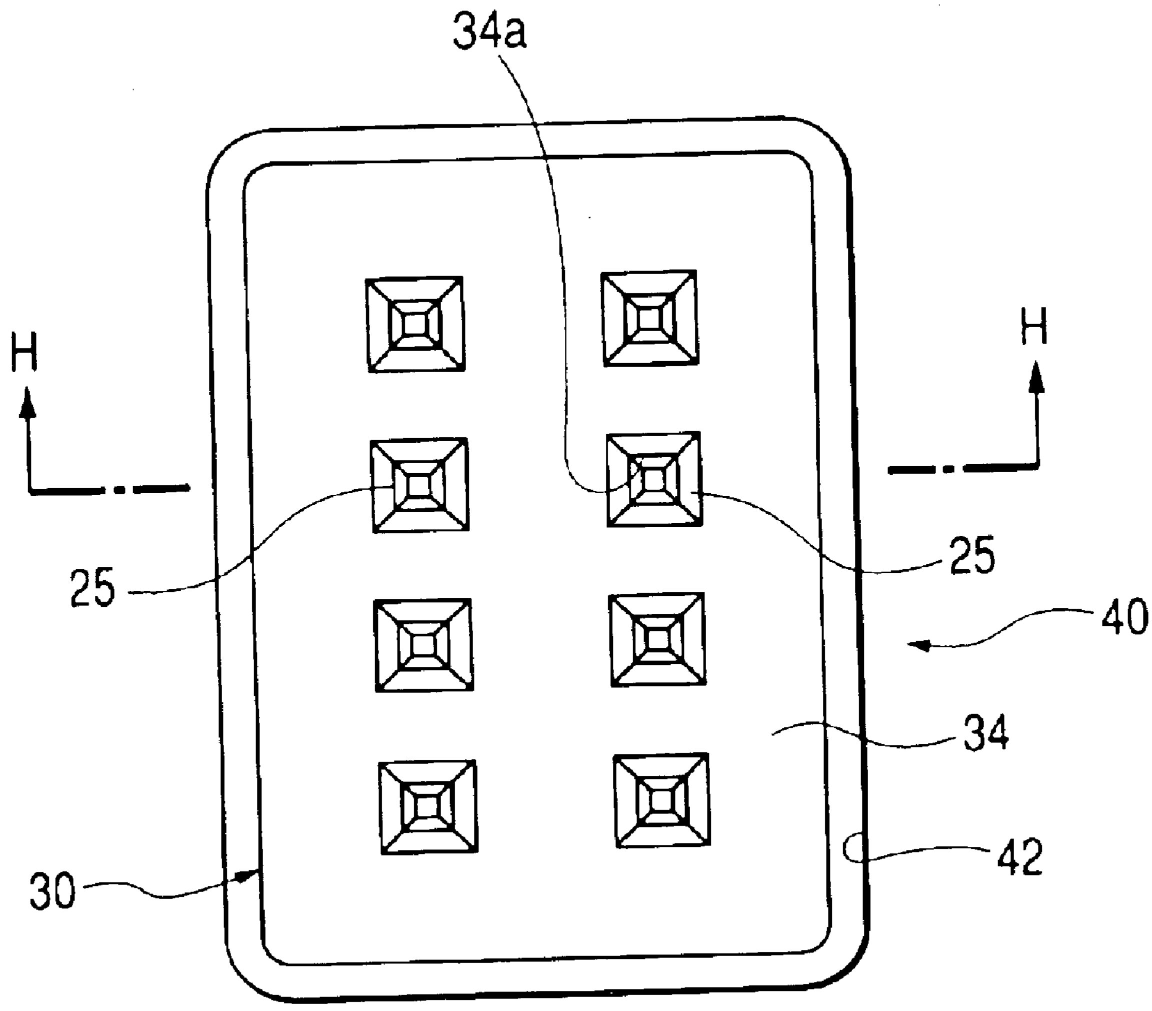
FIG. 8 is an enlarged plan view of a portion E in FIG. 6.
Figure 9:
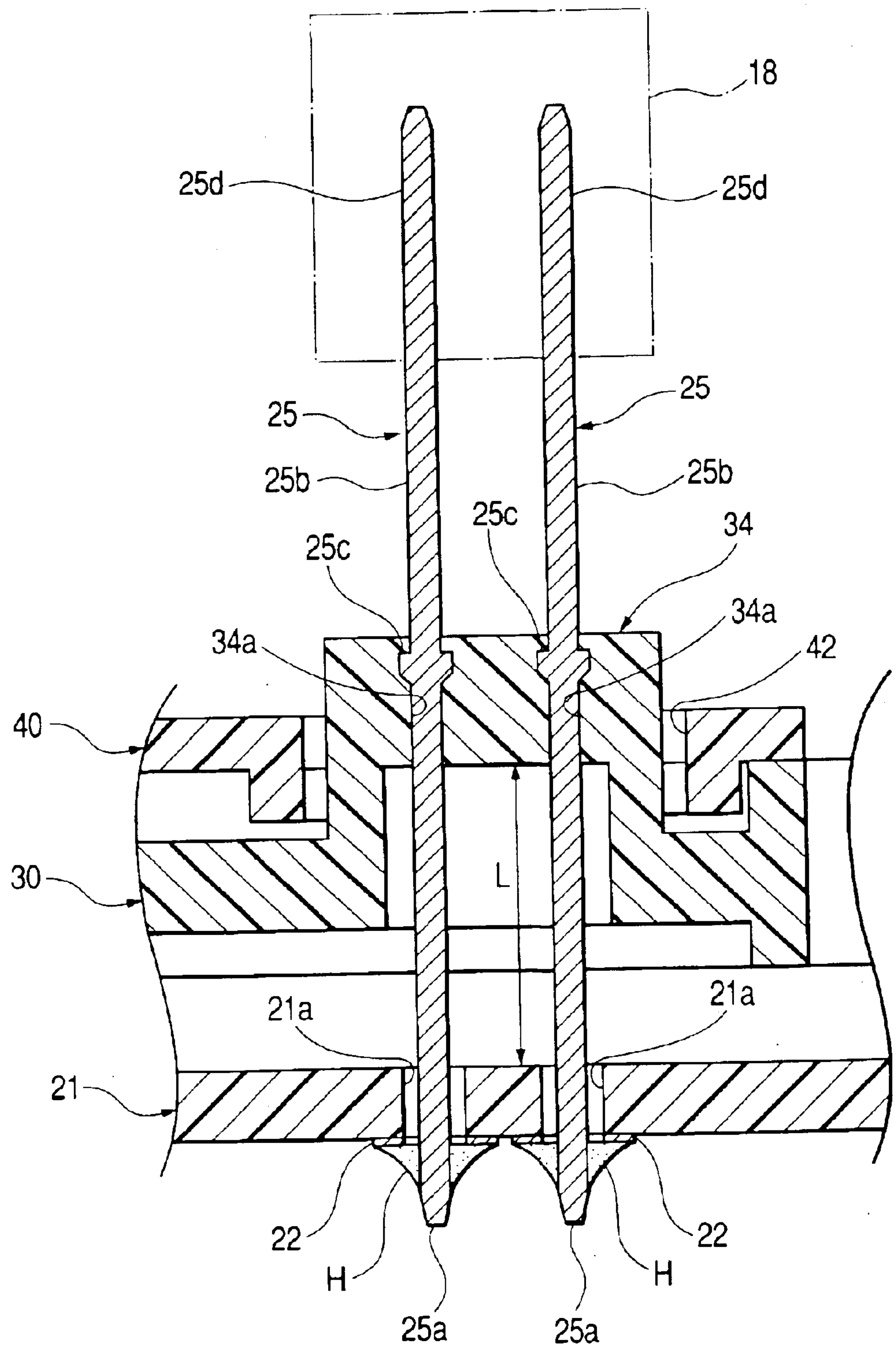
FIG. 9 is a cross-sectional view taken along line H—H in FIG. 8.
Figure 10:
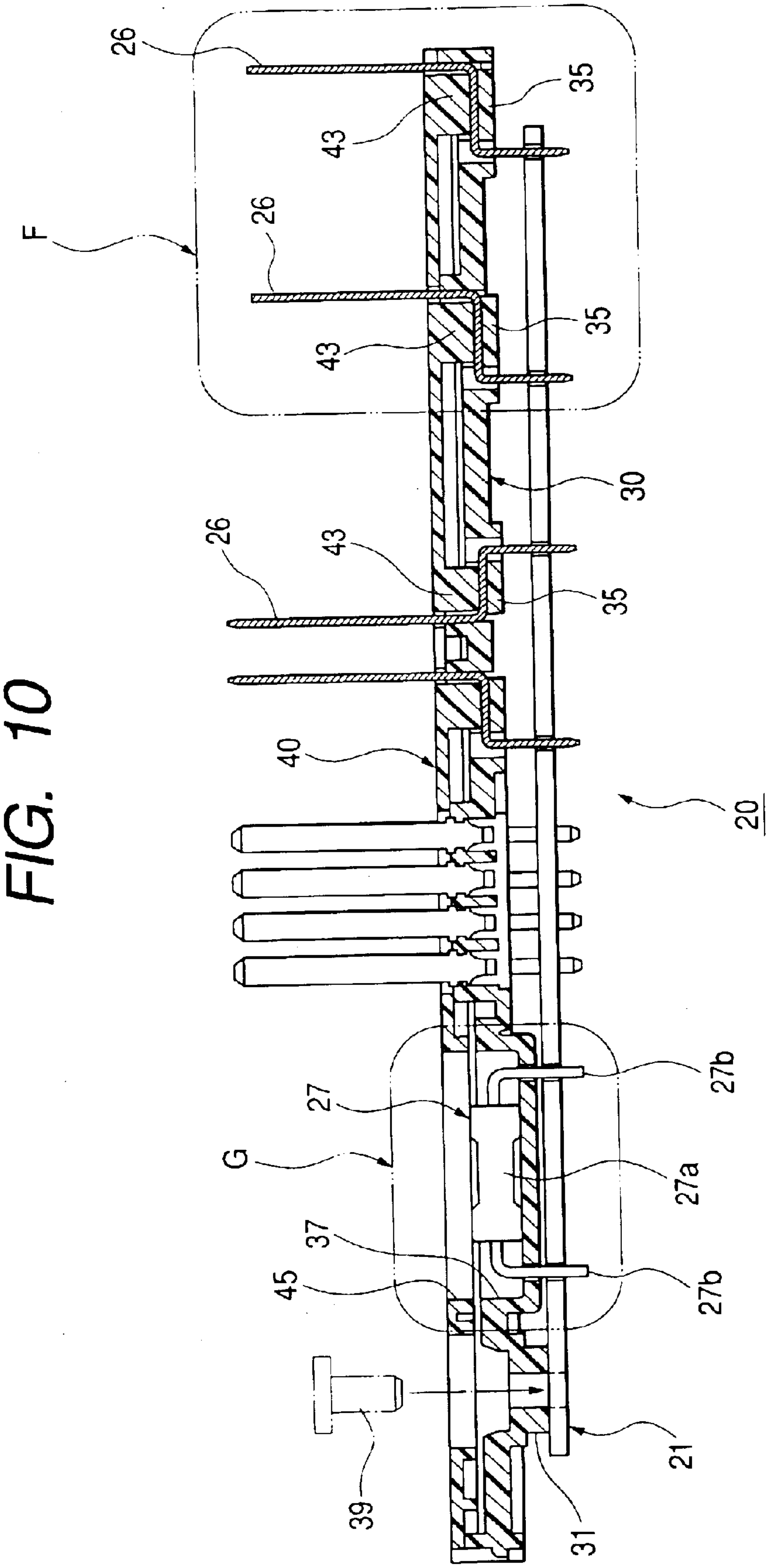
FIG. 10 is a cross-sectional view taken along line B—B in FIG. 4.
Figure 11:
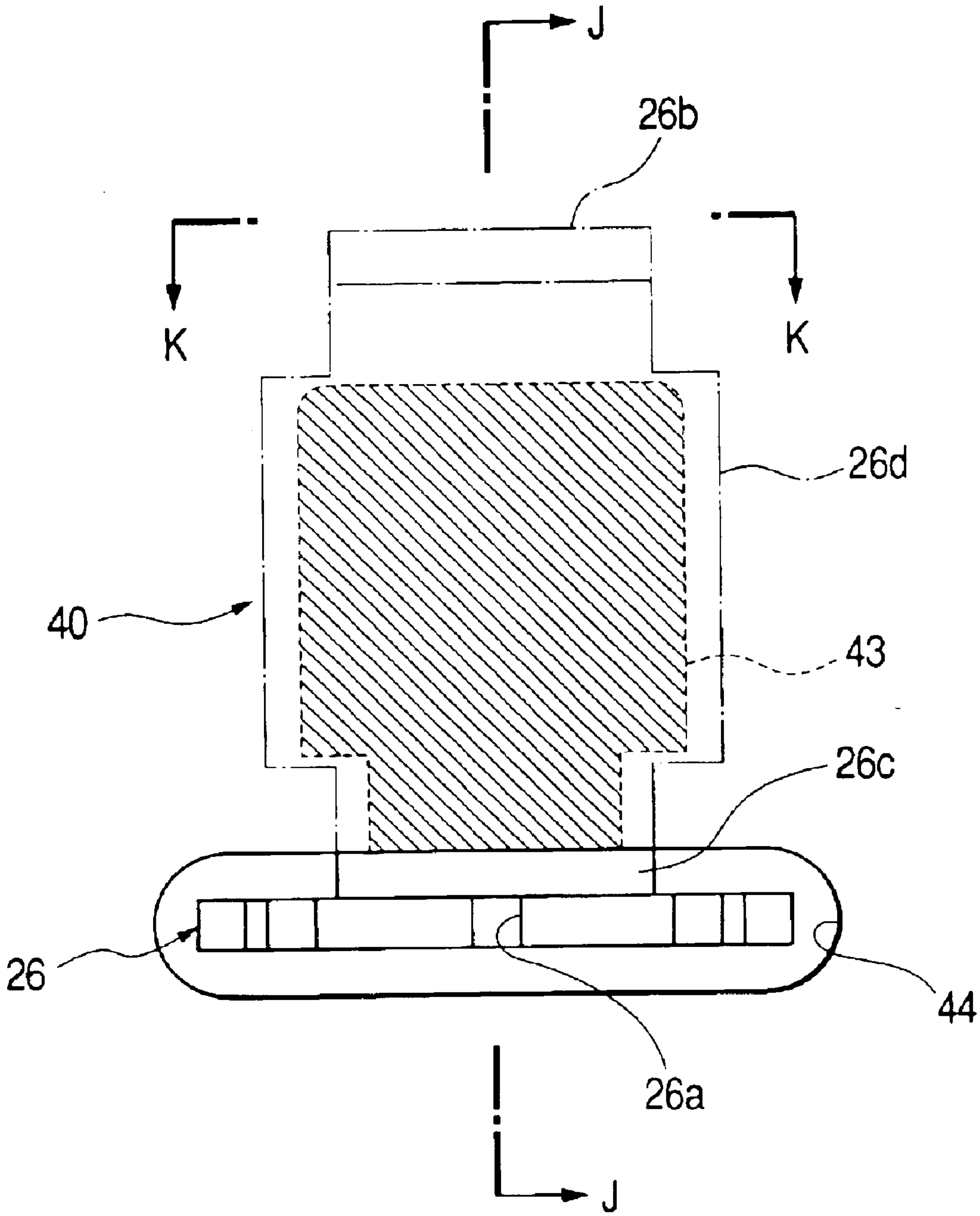
FIG. 11 is an enlarged plan view of a portion F in FIG. 6.
Figure 12:
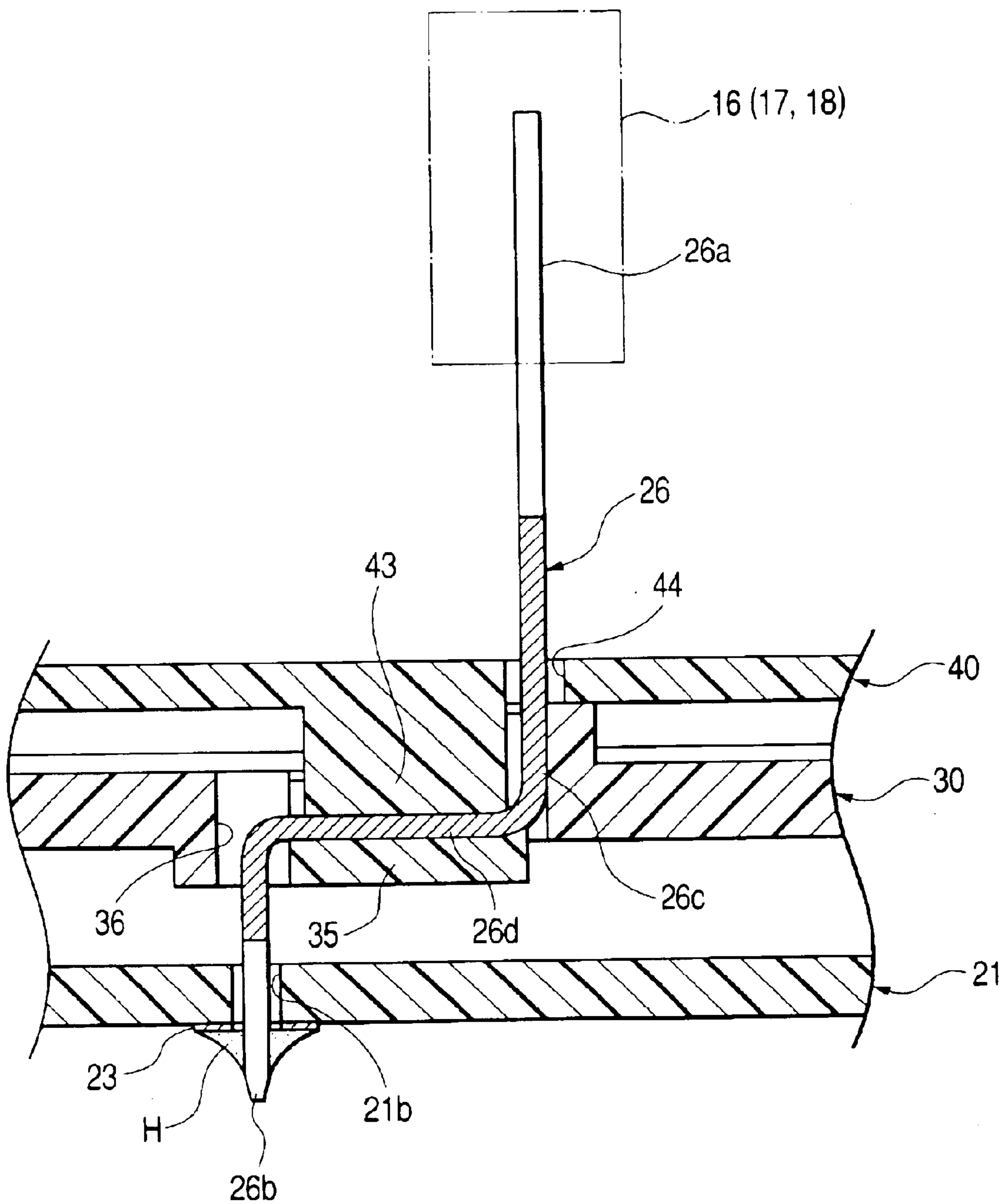
FIG. 12 is a cross-sectional view taken along line J—J in FIG. 11.
Figure 13:
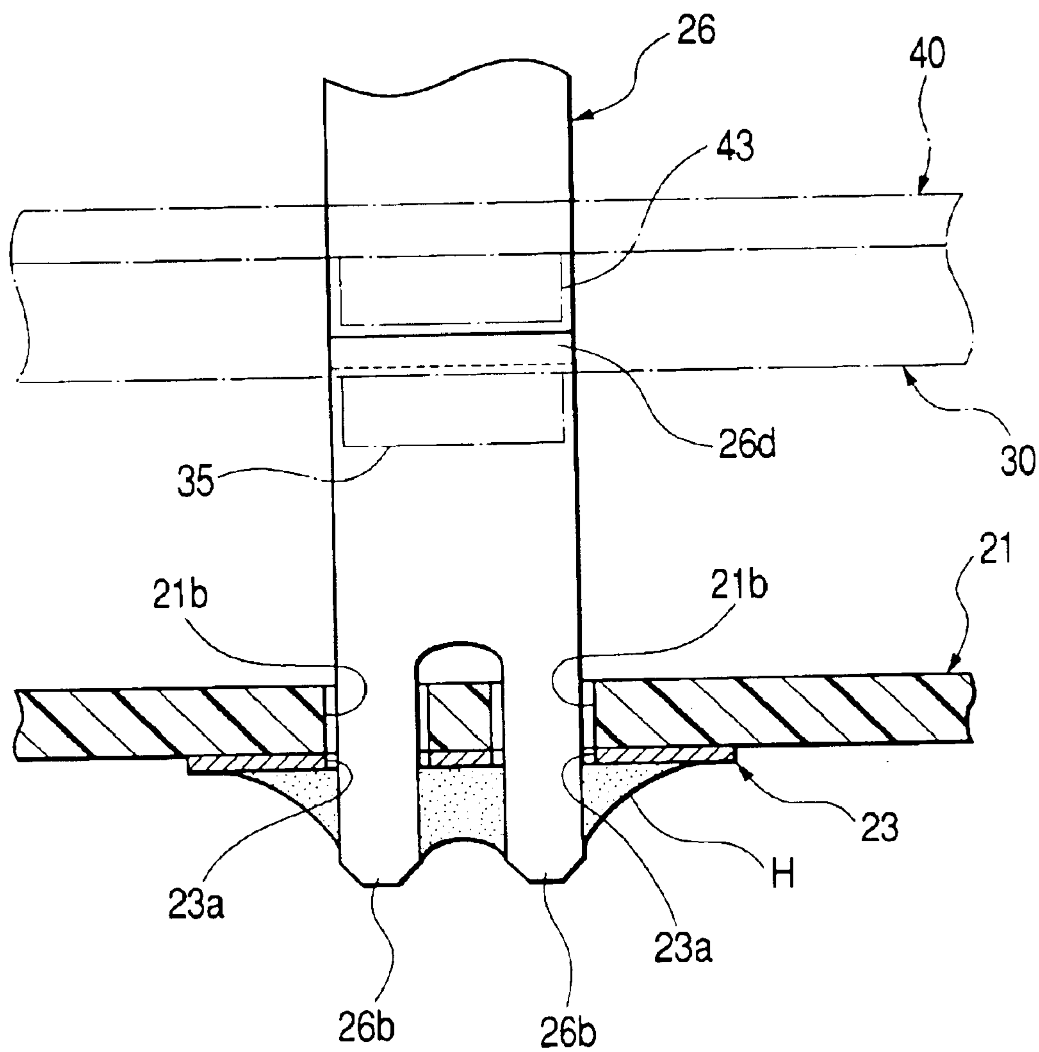
FIG. 13 is a cross-sectional view taken along line K—K in FIG. 11.
Figure 14:
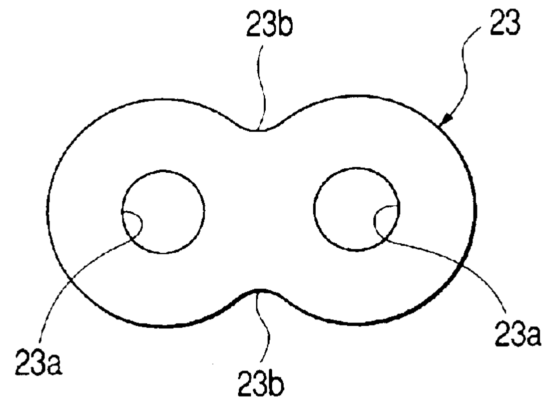
FIG. 14 is an explanatory diagram of a land portion used in the electronic control unit.
Figure 15:
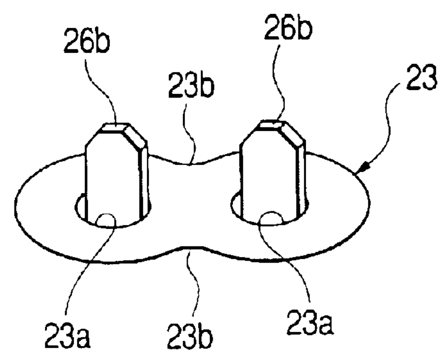
FIG. 15 is a perspective view illustrating the relationship between the land portion and a terminal.
Figure 16:
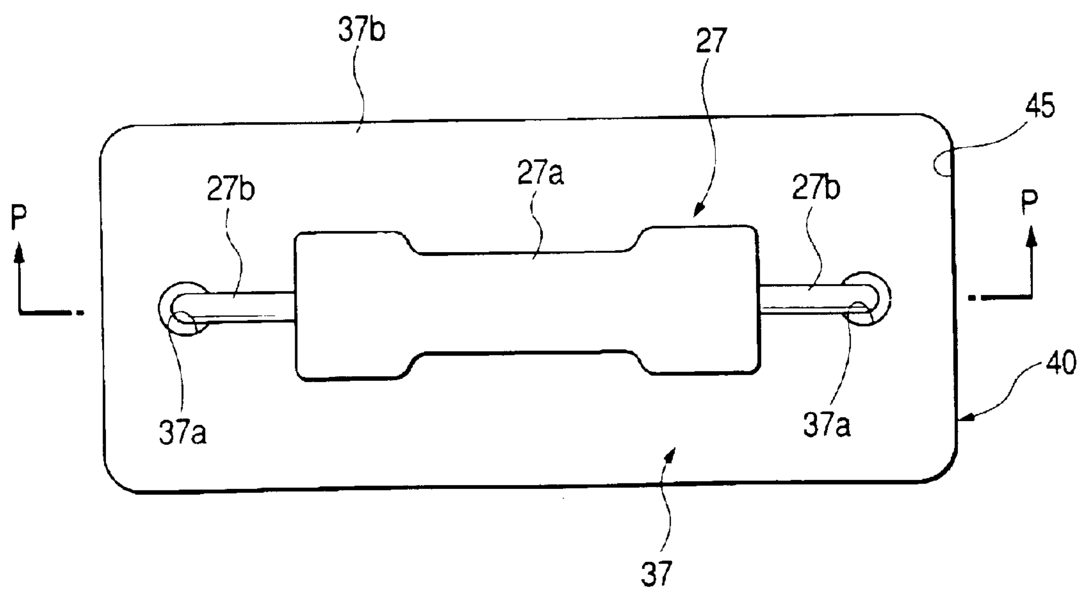
FIG. 16 is an enlarged view of a portion G in FIG. 6.
Figure 17:
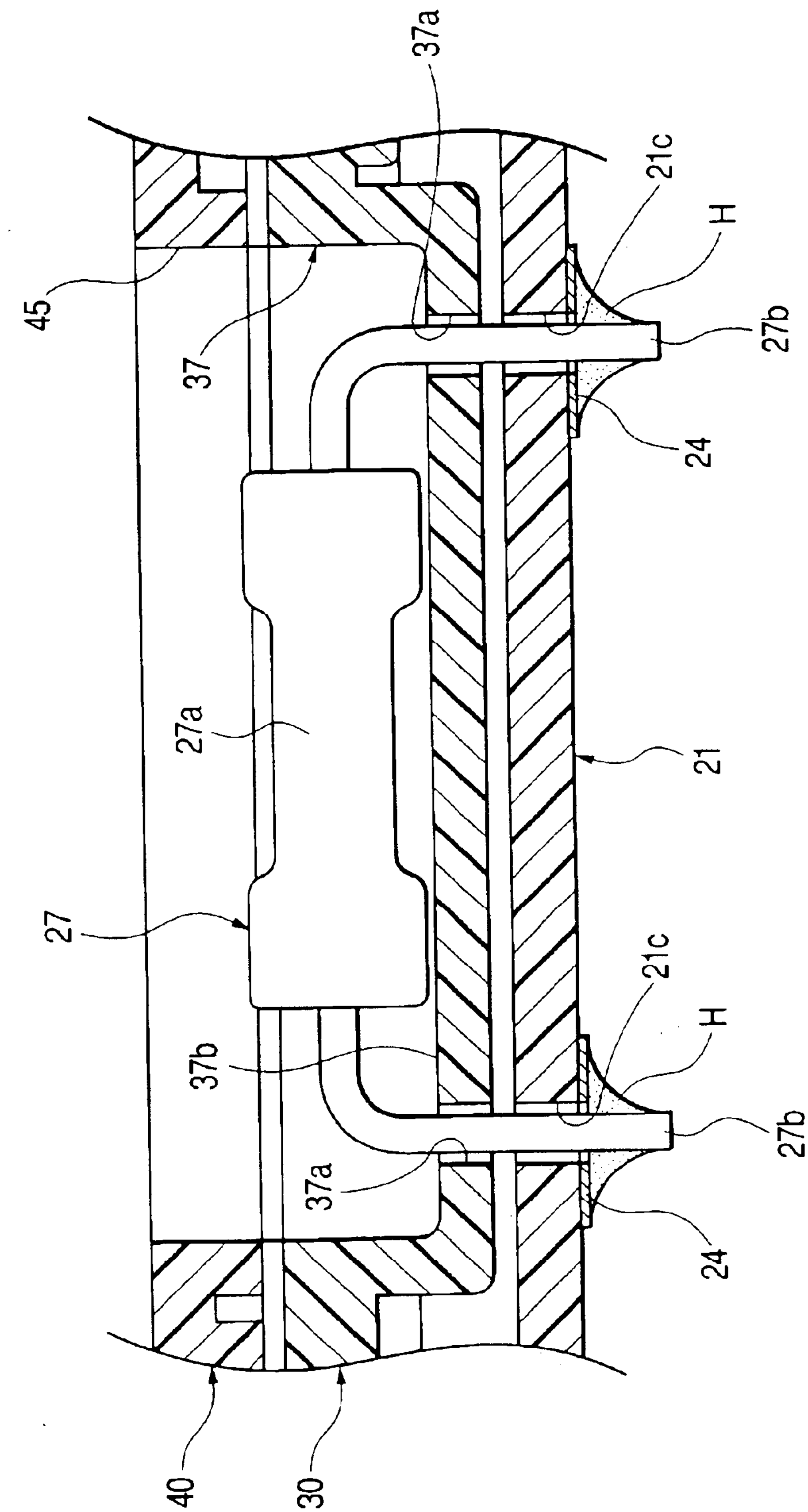
FIG. 17 is a cross-sectional view taken along line P—P in FIG. 16.
Figure 18:
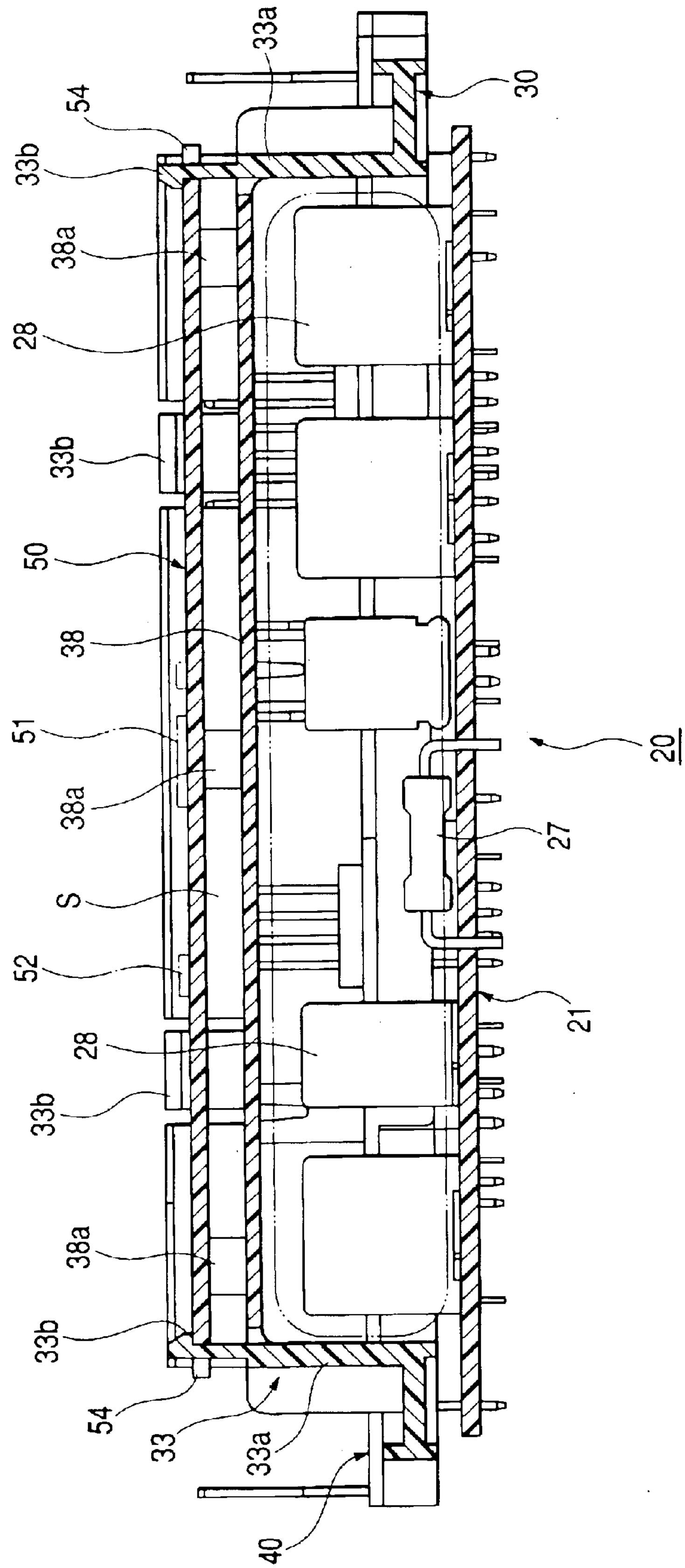
FIG. 18 is a cross-sectional view taken along line C—C in FIG. 4.
Figure 19:
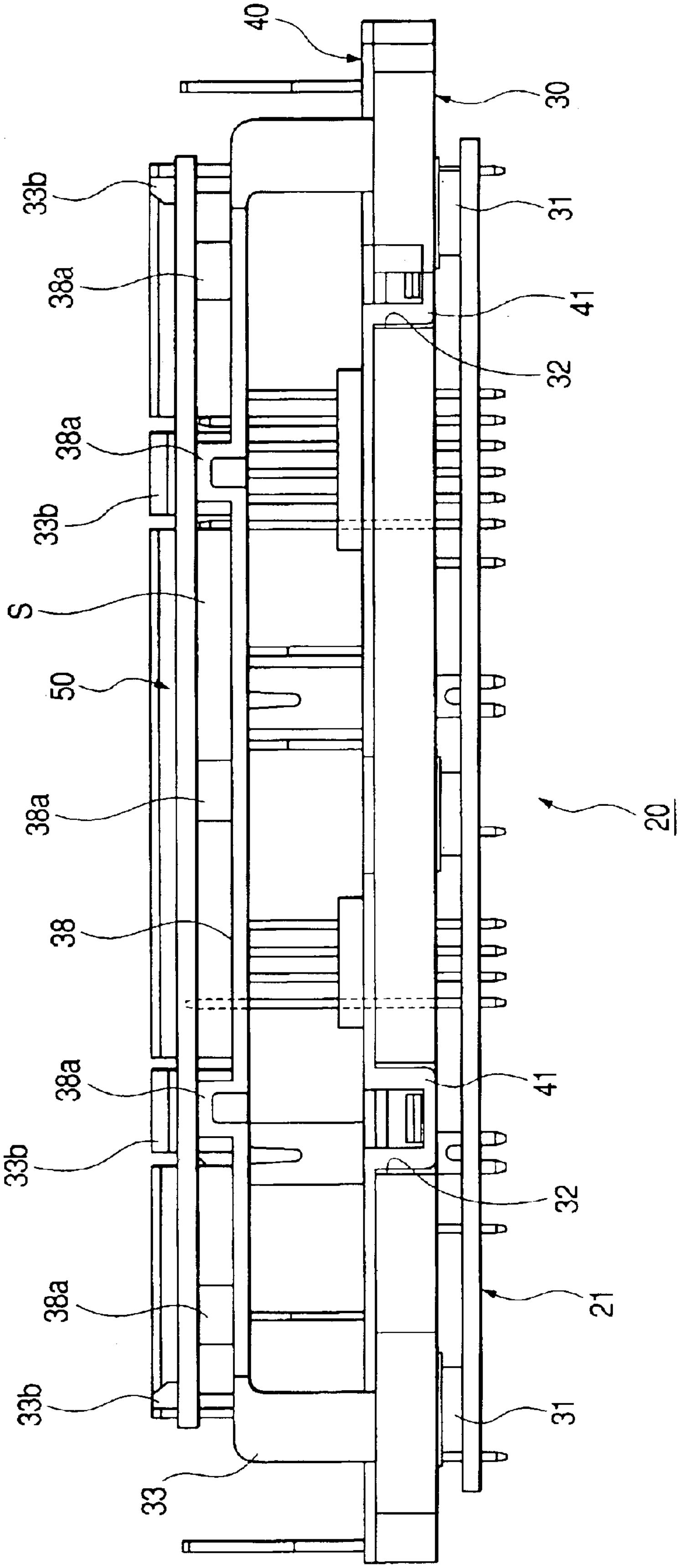
FIG. 19 is a right-hand side elevational view of the electronic control unit.
Figure 20A:
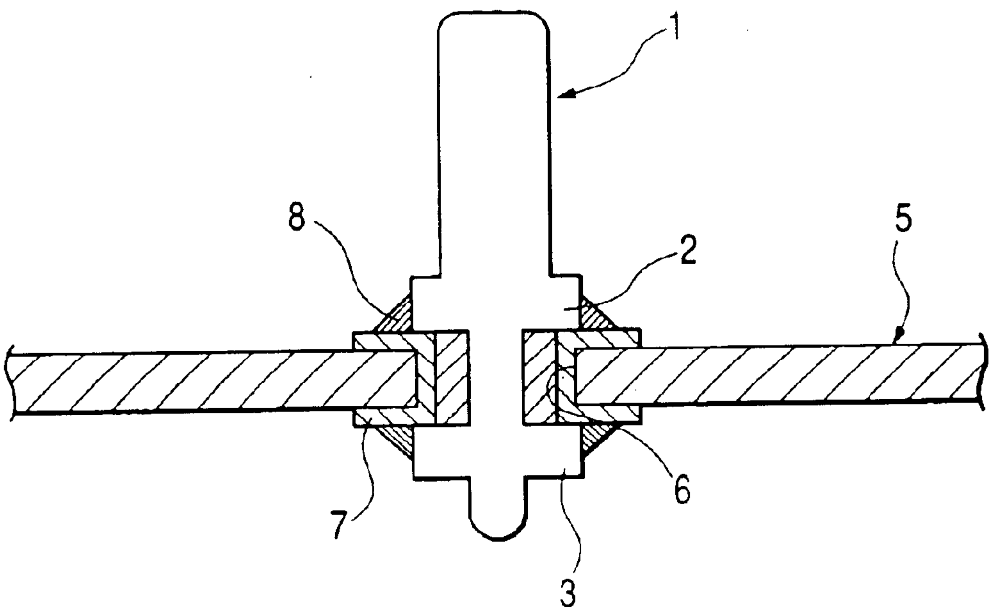
FIG. 20A is a vertical front cross-sectional view illustrating a state of soldering between a terminal and a substrate according to a conventional example.
Figure 20B:
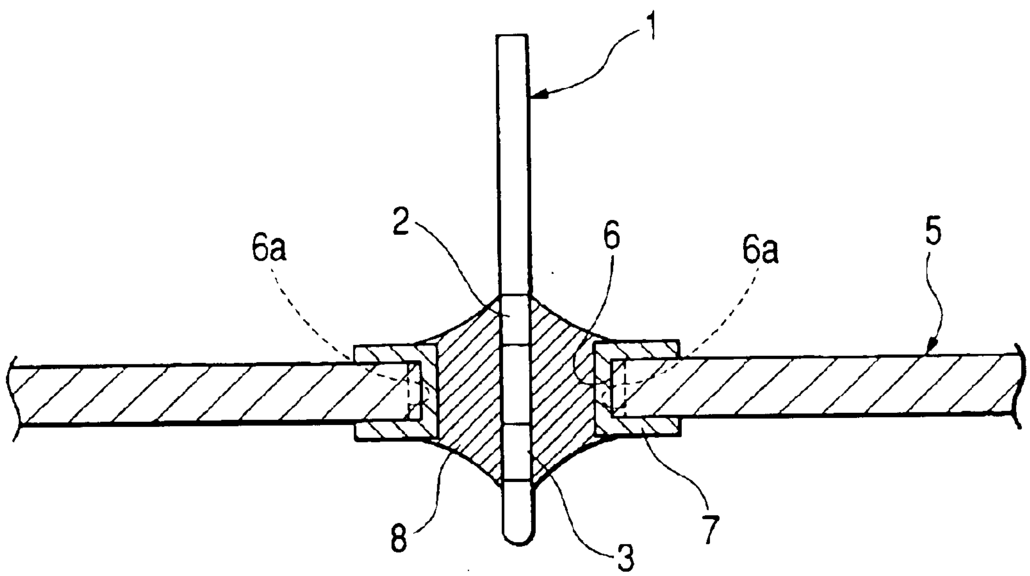
FIG. 20B is a vertical side cross-sectional view of that state.
Figure 21A:
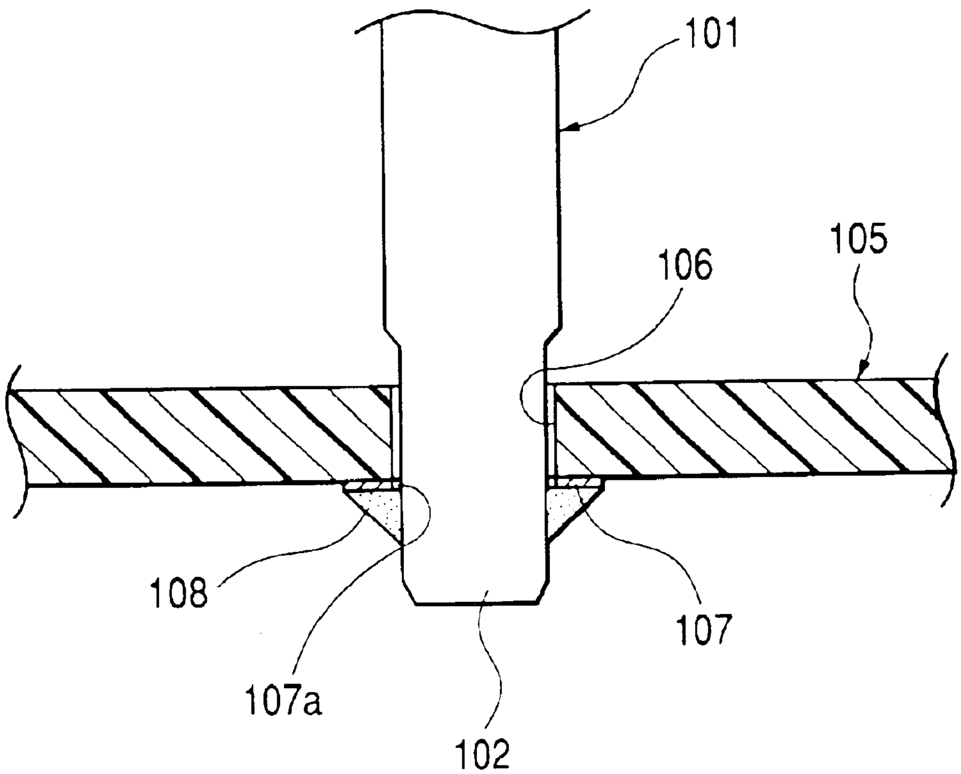
FIG. 21A is a cross-sectional view illustrating a state of soldering between a terminal and a substrate according to a conventional example.
Figure 21B:
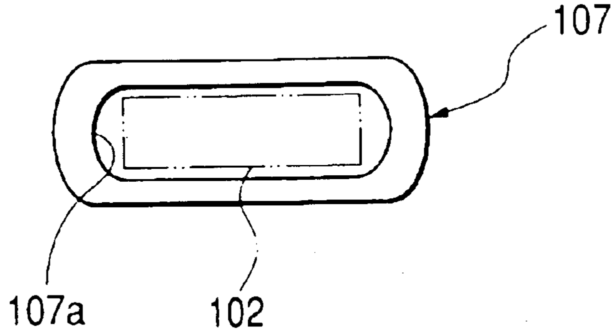
FIG. 21B is an explanatory diagram of the land portion formed on the substrate.
Figure 22:
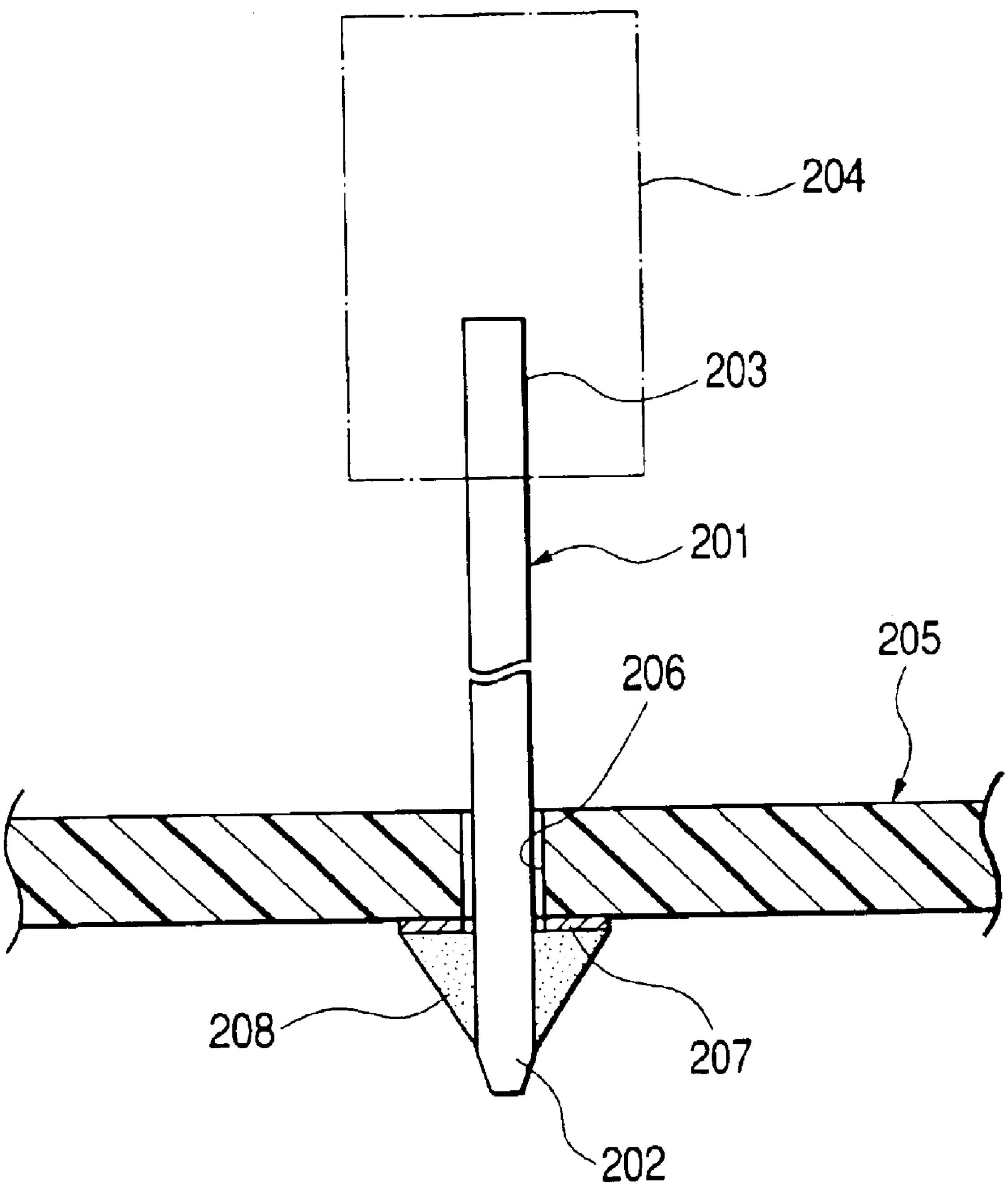
FIG. 22 is a cross-sectional view illustrating a state of soldering between a terminal and a substrate according to a conventional example.

FIG. 1 is an exploded front elevational view illustrating an electric junction box of an electronic control unit-integrated type. FIG. 2 is a front elevational view of the electric junction box. FIG. 3 is a plan view of the electric junction box. FIG. 4 is a plan view of an electronic control unit incorporated in the electric junction box. FIG. 5 is a front elevational view of the electronic control unit. FIG. 6 is a cross-sectional view taken along line D—D in FIG. 5. FIG. 7 is a cross-sectional view taken along line A—A in FIG. 4. FIG. 8 is an enlarged plan view of a portion E in FIG. 6. FIG. 9 is a cross-sectional view taken along line H—H in FIG. 8. FIG. 10 is a cross-sectional view taken along line B—B in FIG. 4. FIG. 11 is an enlarged plan view of a portion F in FIG. 6. FIG. 12 is a cross-sectional view taken along line J—J in FIG. 11. FIG. 13 is a cross-sectional view taken along line K—K in FIG. 11. FIG. 14 is an explanatory diagram of a land portion used in the electronic control unit. FIG. 15 is a perspective view illustrating the relationship between the land portion and a terminal. FIG. 16 is an enlarged view of a portion G in FIG. 6. FIG. 17 is a cross-sectional view taken along line P—P in FIG. 16. FIG. 18 is a cross-sectional view taken along line C—C in FIG. 4. FIG. 19 is a right-hand side elevational view of the electronic control unit.

As shown in FIGS. 1 to 3, an electric junction box 10 of an electronic control unit-integrated type is mainly comprised of a box-shaped upper casing 11 made of a synthetic resin; a box-shaped main cover 12 made of a synthetic resin and adapted to be fitted to the upper casing 11 engageably and disengageably; a bus bar layer 13 disposed on an upper surface side of the main cover 12; and an electronic control unit (ECU) 20 incorporated between the upper casing 11 and the main cover 12 on the lower side of the bus bar layer 13. It should be noted that this electric junction box 10 is used for the main purpose of distributing the power source of an automobile, for instance, and the electronic control unit 20 controls the turning on and off of an engine, lights, wipers, and the like of the automobile, for instance.

As shown in FIG. 1, the bus bar layer 13 is arranged such that a plurality of bus bars 15 are routed on an insulating board 14, and their one end sides are formed by being bent upwardly as insulation displacing portions 15*a* formed in the shape of slit blades and the like. These insulation displacing portions 15*a* and the like of the bus bars 15 respectively project so as to extend to relay fitting portions 12*a* and fuse fitting portions 12*b* which are integrally formed projectingly on the upper surface side of the main cover 12 shown in FIG. 3. Plug-in relays 16 serving as electronic components are fitted in the relay fitting portions 12*a*, and fuses 17 serving as electronic components are fitted in the fuse fitting portions 12*b*.

As shown in FIGS. 1, 4, 5, 10, and 19, the electronic control unit 20 is comprised of a rectangular plate-shaped main board (substrate) 21 which is made of a synthetic resin and on which straight terminals 25 and crank-shaped terminals 26, as well as resistors 27, relays 28, and the like serving as electronic components, are respectively mounted; a substantially plate-shaped terminal plate (heat insulating plate) 30 which is made of a synthetic resin and to a lower surface side of which the main board 21 is fixed by screws 39 or the like so as to oppose the terminal plate 30 and to be spaced apart therefrom with a predetermined clearance with a plurality of hollow cylindrical boss portions 31 interposed therebetween; a plate-shaped plate cover 40 which is made of a synthetic resin and is disposed so as to be located above and oppose a portion of the terminal plate 30 (excluding the area of a frame-shaped holding plate 33) in such a manner as to be spaced apart therefrom with a predetermined clearance in a state in which a plurality of projecting portions 41 such as hook portions fitting in a plurality of recessed portions 32 of the terminal plate 30 are interposed therebetween; and a rectangular plate-shaped control board 50 which is laminated and held on the main board 21 in such a manner as to be spaced apart therefrom by a predetermined distance with the holding plate 33 of the terminal plate 30 disposed therebetween, a plurality of control components 51 and 52 such as a microcomputer (CPU) being mounted on the control board 50 which is connected to the main board 21 by means of a jumper wire 53 and unillustrated terminals and the like.

As shown in FIGS. 6 to 9, when the main board 21 and the terminal plate 30 are assembled together, soldering portions 25*a* at the lower ends of the straight, rod-shaped terminals 25 are adapted to be respectively guided into connecting holes 21*a* of the main board 21 by the terminal plate 30. Namely, when the main board 21 and the terminal plate 30 are assembled, the positions of the connecting holes 21*a* in the main board 21 and positioning holes 34*a* in the terminal plate 30 for holding intermediate portions 25*b* of the terminals 25 are aligned, and soldering portions 25*a* of the terminals 25 are guided and inserted into the connecting holes 21*a* of the main board 21 at a position opposing the main board 21 and spaced apart therefrom with a predetermined clearance.

Then, the soldering portions 25*a* of the terminals 25 inserted into the connecting holes 21*a* of the main board 21 are adapted to be soldered to land portions 22 formed on the lower surface of the main board 21 with the terminals 25 set vertically upright, and are held by the main board 21. These soldered portions (solder fillets) are denoted by reference character H.

In addition, the intermediate portion 25*b* of each terminal 25 has a projecting portion (retaining portion) 25*c* which is formed integrally in such a manner as to project annularly and which is retained in the positioning hole 34*a* of the terminal plate 30. Further, the positioning holes 34*a* of the terminal plate 30 are provided in two rows in the center of a terminal press-fitting portion 34 which projects in a block shape upwardly from the upper surface of the terminal plate 30. This terminal press-fitting portion 34 projects upwardly of an opening 42 in the plate cover 40, and an upper end 25*d* of the terminal 25 exposed from the terminal press-fitting portion 34 projects up to a connector fitting portion 12*c* of the main cover 12. An external connector 18 serving as an electric component is adapted to be engaged with this upper end 25*d* of the terminal 25.

It should be noted that the projecting portion 25*c* of each terminal 25 is retained by being press fitted to a predetermined position in the positioning hole 34*a* of the terminal plate 30, and this retained state is such that the projecting portion 25*c* of the terminal 25 is sufficiently prevented from becoming dislocated by a mechanical stress caused by the attachment or detachment of the external connector 18.

As shown in FIG. 4 and FIGS. 10 to 13, the terminals 26 for a large current, which are cranked in the L-shape and are wide as a whole, have upper ends (one ends) formed as insulation displacing portions 26*a* in the shape of slit blades, and heat generating components such as the plug-in relays 16 or the fuses 17 and the external connectors 18 are connectable thereto. In addition, a pair of bifurcated soldering portions 26*b* at the lower end (the other end) of each terminal 26 are inserted into connecting holes 21*b* of the main board 21 with the terminals 26 set vertically upright, are soldered to land portions 23 formed on the lower surface of the main board 21, and are held by the main board 21. These soldered portions (solder fillets) are denoted by reference character H.

In addition, as shown in FIGS. 11 and 12, a wide flat portion 26*d* is formed in an intermediate portion 26*c* of the terminal 26 by being bent so as to be parallel with the main board 21. This flat portion 26*d* is capable of freely abutting against a terminal pressing portion 35 of the terminal plate 30, which is disposed at a position opposing the main board 21 and spaced apart therefrom with predetermined clearance. Meanwhile, the wide flat portion 26*d* of the terminal 26 is capable of freely abutting against a terminal pressing portion 43 which is provided on the resin plate cover 40 covering the terminal plate 30 and spaced apart from the terminal plate 30 with a predetermined clearance. Namely, the wide flat portions 26*d* of the terminal 26 are respectively clamped by the terminal pressing portions 35 of the terminal plate 30 and the terminal pressing portions 43 of the plate cover 40.

It should be noted that terminal inserting holes 36 and 44 are respectively formed in the vicinities of the terminal pressing portions 35 and 43 of the terminal plate 30 and the plate cover 40. In addition, the insulation displacing portions 26*a* of the terminals 26 exposed from the terminal inserting holes 44 of the plate cover 40 project to the relay fitting portions 12*a*, the fuse fitting portions 12*b*, the connector fitting portions 12*c*, and the like. Further, as shown by a hatched portion in FIG. 11, the terminal pressing portion 43 of the plate cover 40 is formed to be wide with the substantially same shape as that of the wide flat portion 26*d* of the terminal 26. As shown in FIG. 13, the terminal pressing portion 35 of the terminal plate 30 is similarly formed to be wide.

In addition, as shown in FIGS. 13 and 15, the lower end of the wide terminal 26 cranked in the L-shape is segmented by being bifurcated as the soldering portions 26*b*. In addition, the pair of connecting holes 21*b* are respectively formed in the main board 21 at positions opposing the pair of soldering portions 26*b* of the terminal 26. Further, as shown in FIGS. 13 to 15, a pair of round terminal inserting holes 23*a* are respectively formed in the land portion 23 at positions opposing the pair of soldering portions 26*b* of the terminal 26. Further, a pair of indented portions 23*b* are formed on both peripheral sides of a central portion of the land portion 23 located between the pair of terminal inserting holes 23*a* of the land portion 23.

As shown in FIGS. 6, 10, 16, and 17, a component accommodating portion 37 for accommodating and holding a resistor (heat generating component) 27 is formed at a predetermined position on the terminal plate 30 in a recessed manner. A pair of inserting holes 37*a* and a pair of inserting holes 21*c*, into both of which a pair of lead portions 27*b* projecting from both sides of a component body 27*a* of the resistor 27 are inserted, are respectively formed in the recessed component accommodating portion 37 and the main board 21.

Further, each lead portion 27*b* and a land portion 24 formed on the lower surface side of the main board 21 are held in such a manner as to be capable of being freely fixed by soldering in a state in which the respective lead portions 27*b* of the resistor 27 are inserted in the inserting holes 37*a* and 21*c* of the recessed component accommodating portion 37 and the main board 21, and the component body 27*a* of the resistor 27 is spaced apart from a bottom surface 37*b* of the recessed component accommodating portion 37. The soldered portion (solder fillet) is denoted by reference character H. Incidentally, an opening 45 of the same shape as that of the component accommodating portion 37 is formed in the plate cover 40 at a position opposing the component accommodating portion 37.

As shown in FIGS. 5 to 7, 18, and 19, the main board 21, on which heat generating components such as the resistors 27 and the relays 28 are mounted by means of the frame-shaped holding plate 33 integrally formed projectingly on the right side of the terminal plate 30, and the control board 50, on which the control components 51 and 52 such as the microcomputer (CPU) are mounted, are held and laminated in such a manner as to be spaced apart a predetermined distance. Namely, on the ceiling side of the holding plate 33, a heat insulating plate 38 is integrally formed on upper ends of a pair of side wall portions 33*a* of the holding plate 33. An air layer S is formed between the heat insulating plate 38 and the control board 50 in a state in which a plurality of projecting portions 38*a* integrally formed projectingly on the upper surface of the heat insulating plate 38 are interposed therebetween.

In addition, the control board 50 is positioned by means of a plurality of hook portions 33*b*, which are integrally formed projectingly on the pair of side wall portions 33*a* of the holding plate 33 and the heat insulating plate 38, and are retained by a plurality of recessed portions 54 formed in the control board 50. Further, the air layer S between the heat insulating plate 38 and the control board 50 is constantly maintained at a fixed value with the projecting portions 38*a* of the heat insulating plate 38 interposed therebetween.

According to the electric junction box 10 of the electronic control unit-integrated type in accordance with the above-described embodiment, the arrangement provided is such that, as shown in FIG. 9, the projecting portion 25*c* which is integrally formed projectingly on the intermediate portion 25*b* of each straight, rod-shaped terminal 25 is retained by being press fitted in the positioning hole 34*a* of the terminal plate 30 disposed at the position opposing the main board 21 and spaced apart therefrom with a predetermined clearance. Accordingly, when the external connector 18 is attached to or detached from the terminal 25, it is possible to alleviate the mechanical stress applied to the soldered portion H between the soldering portion 25*a* of the terminal 25 and the land portion 22 on the main board 21. In addition, since the projecting portion 25*c*, which serves as a point of fixation of the terminal 25 retained in the positioning hole 34*a* of the terminal plate 30, is disposed away from the soldered portion H, it is possible to alleviate the thermal stress applied to the soldered portion H. Furthermore, since the projecting portion 25*c* of the terminal 25 and the land portion 22 on the main board 21 are not located in close proximity to each other in the conventional manner, but are located away from each other, the land portion 22 on the main board 21 is not damaged by the projecting portion 25*c* of the terminal 25. For these reasons, it is possible to reliably prevent the occurrence of the solder cracks in the soldered portion H.

In particular, as shown in FIG. 9, since the positioning holes 34*a* of the terminal plate 30, in which the projecting portions 25*c* of the terminals 25 are retained, are formed in the terminal press-fitting portion 34 projecting upwardly from the upper surface of the terminal plate 30, it is possible to secure a sufficient distance (clearance) from the projecting portion 25*c* of the respective terminal 25 to the soldered portion H, thereby making it possible to reliably alleviate stresses including the mechanical stress and the thermal stress applied to the soldered portion H. In addition, the environmental heat in the surroundings including the engine heat, as well as the heat generated by such as the self heating of heat generating components including the relays 28 connected to the terminals 26 in the vicinities of the terminals 25, can be reliably dissipated from the projecting portions 25*c* of the terminals 25 to the side of the synthetic resin terminal plate 30 serving as the heat insulating plate, thereby making it possible to further improve the heat dissipating effect.

According to the electric junction box 10 of the electronic control unit-integrated type in accordance with the above-described embodiment, the arrangement provided is such that, as shown in FIGS. 12 and 13, the soldering portion of the wide terminal 26 for large-current use is divided into small portions by being bifurcated as the soldering portions 26*b*. Accordingly, the solder stress due to the heat (heat generated by such as the self heating of a heat generating component including the relay 16 connected to the insulation displacing portion 26*a* of the terminal 26) which is applied to the soldered portion H between, on the one hand, the pair of soldering portions 26*b* of the terminal 26 and, on the other hand, the land portion 23 on the main board 21 can be dispersed and alleviated by the pair of soldering portions 26*b* of the terminal 26. Hence, it is possible to reliably prevent the occurrence of a solder crack in the soldered portion H.

In addition, since the pair of connecting holes 21*b* are respectively formed in the main board 21 at positions opposing the pair of soldering portions 26*b* of the terminal 26, and the pair of round terminal inserting holes 23*a* are respectively formed in the land portion 23 at positions opposing the pair of soldering portions 26*b* of the terminal 26, a high-quality land portion 23 can be formed simply, thereby making it possible to lower the cost of the overall main board 21.

Further, as shown in FIGS. 14 and 15, since the pair of substantially U-shaped indented portions 23*b* are respectively formed on both peripheral sides of the central portion of the land portion 23 located between the pair of terminal inserting holes 23*a* of the land portion 23, a change takes place in the surface tension of the solder in the soldered portion H around the outer periphery of the land portion 23 by means of the pair of indented portions 23*b*. In consequence, it is possible to form a satisfactory solder shape (fillet shape) thereby making it possible to improve the durability of the soldered portion H.

Further, as shown in FIGS. 12 and 13, since the flat portion 26*d*, which serves as a point of fixation of the terminal 26 clamped between the terminal pressing portion 35 of the terminal plate 30 and the terminal pressing portion 43 of the plate cover 40, is disposed away from the soldered portion H, it is possible to alleviate the thermal stress applied to the soldered portion H. Furthermore, since the flat portion 26*d* of the terminal 26 is clamped between the terminal pressing portion 35 of the terminal plate 30 and the terminal pressing portion 43 of the plate cover 40, when the external connector 18 or the like is attached to or detached from the insulation displacing portion 26*a* of the terminal 26, it is possible to alleviate the dynamic stress applied to the soldered portion H between each of the pair of soldering portions 26*b* of the terminal 26 and the land portion 23 on the main board 21. For these reasons, it is possible to reliably prevent the occurrence of the solder crack in the soldered portion H.

According to the electric junction box 10 of the electronic control unit-integrated type in accordance with the above-described embodiment, the arrangement provided is such that, as shown in FIG. 12, the wide flat portion 26*d* is formed by being bent at the intermediate portion 26*c* of the terminal 26, and the terminal plate 30 is disposed at a position opposing the main board 21 and spaced apart therefrom with a predetermined clearance, and the flat portion 26*d* of the terminal 26 is made capable of freely abutting against the terminal pressing portion 35 provided on the terminal plate 30. Accordingly, the environmental heat in the surroundings including the engine heat, which is transmitted to the soldered portion H between the soldering portion 26_b_ of the terminal 26 and the land portion 23 on the main board 21, as well as the heat generated by such as the self heating of the relay 16 or the fuse 17 connected to the insulation displacing portion 26_a_ of the terminal 26, can be dissipated to the terminal pressing portion 35 side of the terminal plate 30 through the flat portion 26_d_ of the terminal 26, thereby making it possible to improve the heat dissipating effect. In consequence, it is possible to alleviate the thermal stress applied to the soldered portion H, and prevent the occurrence of the solder crack in the soldered portion H.

In particular, since the flat portion 26_d_ of the terminal 26 is made capable of being freely clamped by the terminal pressing portion 35 of the terminal plate 30 and the terminal pressing portion 43 of the plate cover 40 for covering the terminal plate 30, the heat which is caused by the self heating of the relay 15 or the fuse 17 connected to the insulation displacing portion 26_a_ of the terminal 26, and which is transmitted to the soldered portion H, can be efficiently dissipated to the sides of the terminal pressing portions 35 and 43 of the terminal plate 30 serving as the synthetic resin heat insulating plate and the synthetic resin plate cover 40, respectively, through the wide flat portion 26_d_ of the terminal 26, thereby making it possible to further improve the heat dissipating effect of the heat generating components such as the relays 16 and the fuses 17.

In addition, since the flat portion 26_d_ of the terminal 26 is arranged to be freely clamped and fixed by the terminal pressing portion 35 of the terminal plate 30 and the terminal pressing portion 43 of the plate cover 40, when the relay 16, the fuse 17, or the like is attached to or detached from the insulation displacing portion 26_a_ of the terminal 26, it is possible to reliably alleviate the dynamic stress applied to the soldered portion H between the soldering portion 26_b_ of the terminal 26 and the land portion 23 on the main board 21. Furthermore, since it is possible to secure a sufficient distance (clearance) to the soldered portion H from the flat portion 26_d_ serving as a point of fixation of the terminal 26 which is clamped between the terminal pressing portion 35 of the terminal plate 30 and the terminal pressing portion 43 of the plate cover 40, it is possible to reliably alleviate the thermal stress applied to the soldered portion H. For these reasons, stresses including the thermal stress and the dynamic stress applied to the soldered portion H can be more reliably alleviated in a limited space (heightwise direction) of the electronic control unit 20, thereby making it possible to more reliably prevent the occurrence of the solder crack in the soldered portion H.

It should be noted that, in accordance with the above-described embodiment, although a description has been given of the electronic control unit-integrated type electric junction box incorporating an electronic control unit, it goes without saying that this embodiment is also applicable to an electronic control unit separate from the electric junction box, an electric junction box not incorporating the electronic control unit, and so on.

As described above, in accordance with the invention according to claim 1, since the retaining portion provided in the intermediate portion of the terminal is retained in the positioning hole of the terminal plate which is disposed at a position opposing the substrate and spaced apart therefrom with a predetermined clearance, when an electric component is attached to or detached from the terminal, it is possible to alleviate a mechanical stress applied to a soldered portion between the soldering portion of the terminal and a land portion on the substrate. In addition, since the retaining portion of the terminal which is retained in the positioning hole of the terminal plate is located away from the soldered portion, it is possible to alleviate a thermal stress applied to the soldered portion. Furthermore, since the retaining portion of the terminal and the land portion on the substrate are located away from each other, the land portion on the substrate is prevented from becoming damaged by the retaining portion of the terminal. For these reasons, the occurrence of solder cracks in the soldered portions can be reliably prevented.

In accordance with the invention according to claim 2, since the positioning hole of the terminal plate is provided in the terminal press-fitting portion projecting upwardly from the upper surface of the terminal plate, it is possible to secure a sufficient distance between the retaining portion of the terminal and the soldered portion, thereby making it possible to alleviate stresses such as the mechanical stress and the thermal stress applied to the soldered portion. In addition, the environmental heat in the surroundings and the heat generated by such as the self heating of a heat generating component connected to the terminal can be dissipated from the retaining portion of the terminal to the terminal plate side, thereby making it possible to improve the heat dissipating effect.

As described above, in accordance with the invention according to claim 3, since a plurality of soldering portions are formed by dividing the soldering portion of the terminal into small portions, a solder stress due to heat applied to the soldered portion between each of the plurality of soldering portions of the terminal and the land portion of the substrate can be alleviated by the division of the terminal into small portions, thereby making it possible to reliably prevent the occurrence of a solder crack in the soldered portion.

In accordance with the invention according to claim 4, since connecting holes are respectively formed in the substrate at positions opposing the plurality of soldering portions, and round terminal inserting holes are respectively formed in the land portion at positions opposing the plurality of soldering portions, a high-quality substrate can be fabricated at low cost.

In accordance with the invention according to claim 5, since the indented portion is formed in a peripheral side of the central portion of the land portion between the terminal inserting holes, a satisfactory solder fillet can be formed by means of this indented portion, thereby making it possible to improve the durability of the soldered portion.

As described above, in accordance with the invention according to claim 6, the arrangement provided is such that a wide flat portion is formed by being bent at an intermediate portion of the terminal, that a heat insulating plate is disposed at a position opposing the substrate and spaced apart therefrom with a predetermined clearance, and that the flat portion of the terminal is made capable of freely abutting against a terminal pressing portion provided on the heat insulating plate. Therefore, heat which is caused by the self heating of a heat generating component connected to one end side of the terminal, and which is transmitted to the soldered portion between the other end side of the terminal and the substrate, can be dissipated to the terminal pressing portion side of the heat insulating plate through the wide flat portion at the intermediate portion of the terminal, thereby making it possible to further improve the heat dissipating effect. In addition, since the wide flat portion at the intermediate portion of the terminal abuts against the terminal pressing portion of the heat insulating plate and is located away from the soldered portion, it is possible to alleviate the thermal stress applied to the soldered portion. For these reasons, the occurrence of a solder crack in the soldered portion can be prevented.

In accordance with the invention according to claim 7, since the flat portion of the terminal is capable of being freely clamped by the terminal pressing portion provided on the heat insulating plate and the terminal pressing portion provided on the plate cover for covering the heat insulating plate, the heat which is caused by the self heating of a heat generating component connected to one end side of the terminal, and which is transmitted to the soldered portion between the other end side of the terminal and the substrate, can be efficiently dissipated to the sides of the respective terminal pressing portions of the heat insulating plate and the plate cover, respectively, through the flat portion of the terminal, thereby making it possible to further improve the heat dissipating effect. In addition, since the wide flat portion at the intermediate portion of the terminal is made capable of being freely clamped and fixed by the terminal pressing portion of the heat insulating plate and the terminal pressing portion of the plate cover, when the heat generating component is attached to or detached from one end side of the terminal, the dynamic stress applied to the soldered portion can be alleviated. For these reasons, stresses including the thermal stress and the dynamic stress applied to the soldered portion can be alleviated, thereby making it possible to reliably prevent the occurrence of the solder crack in the soldered portion.

What is claimed is:

1. A holding structure of a terminal and a substrate, wherein a soldering portion of said terminal is inserted into a connecting hole of said substrate, and a land portion provided on said substrate and said soldering portion of said terminal are held by soldering in a state that said terminal is set upright, said holding structure comprising:

a terminal plate for guiding said soldering portion into said connecting hole to a position opposing said substrate, forming a predetermined clearance;

a positioning hole for holding an intermediate portion of said terminal provided in said terminal plate; and a retaining portion completely retained in said positioning hole of said terminal plate is provided in said intermediate portion of said terminal, wherein the entirety of said retaining portion is contained within said positioning hole including an upper surface and a lower surface of said retaining portion.

2. The terminal holding structure according to claim 1, wherein said positioning hole of said terminal plate is formed on a terminal press-fitting portion projecting upwardly from an upper surface of said terminal plate.

3. A holding structure of a terminal and a substrate, comprising:

a plurality of soldering portions formed to be bifurcated from a soldering proximal portion of said terminal thereby dividing said soldering proximal portion into small portions;

wherein said soldering portions are held on a land portion of said substrate by soldering, and wherein an indented portion is formed in a peripheral side of a central portion of said land portion located between said terminal inserting holes.

4. The terminal holding structure according to claim 3, wherein connecting holes are respectively formed in said substrate at positions opposing said plurality of soldering portions, and round terminal inserting holes are respectively formed in said land portion at positions opposing said plurality of soldering portions.

5. A heat dissipating structure for a terminal, wherein one end of said terminal is connectable to a heat generating component and another end of said terminal is soldered in an upright state to a substrate, heat dissipating structure comprising:

a wide flat portion formed by being bent at an intermediate portion of said terminal;

a heat insulating plate disposed at a position opposing said substrate with a predetermined clearance;

wherein said wide flat portion of said terminal is made capable of freely abutting against a terminal pressing portion provided on said heat insulating plate, and wherein said wide flat portion of said terminal has a cross-section with a width of said wide flat portion larger than a thickness of said wide flat portion.

6. The heat dissipating structure for a terminal according to claim 5, wherein a resin plate cover for covering said heat insulating plate is provided in such a manner as to be spaced apart from said heat insulating plate with a predetermined clearance, and said flat portion of said terminal is capable of being freely clamped by said terminal pressing portion of said heat insulating plate and a terminal pressing portion provided on said plate cover.

* * * * *